United States Patent
Fukuda et al.

(10) Patent No.: US 8,329,570 B2
(45) Date of Patent: Dec. 11, 2012

(54) METHOD OF MANUFACTURING SEMICONDUCTOR DEVICE

(75) Inventors: Masahiro Fukuda, Yokohama (JP); Ken Sugimoto, Yokohama (JP); Masatoshi Nishikawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/076,660

(22) Filed: Mar. 31, 2011

(65) Prior Publication Data
US 2011/0250748 A1    Oct. 13, 2011

(30) Foreign Application Priority Data
Apr. 9, 2010 (JP) .................................. 2010-090771

(51) Int. Cl.
*H01L 21/3205* (2006.01)
*H01L 21/4763* (2006.01)
(52) U.S. Cl. ................. 438/595; 438/924; 257/E21.158
(58) Field of Classification Search .................. 438/142, 438/197, 275, 285, 294, 705, 778, 783, 924; 257/E21.158
See application file for complete search history.

(56) References Cited

U.S. PATENT DOCUMENTS

| | | | | |
|---|---|---|---|---|
| 5,726,102 A | * | 3/1998 | Lo | 438/718 |
| 6,100,160 A | * | 8/2000 | Hames | 438/424 |
| 6,271,153 B1 | * | 8/2001 | Moore | 438/787 |
| 2008/0251851 A1 | * | 10/2008 | Pan et al. | 257/369 |

FOREIGN PATENT DOCUMENTS
JP    2009-094225 A    4/2009

* cited by examiner

*Primary Examiner* — Leonard Chang
(74) *Attorney, Agent, or Firm* — Westerman, Hattori, Daniels & Adrian, LLP

(57) ABSTRACT

A method of manufacturing a semiconductor device, comprising, forming a first gate electrode in a first region of a semiconductor substrate and forming a second gate electrode in a second region of the semiconductor substrate, forming a first sidewall along a lateral wall of the first gate electrode and forming a second sidewall along a lateral wall of the second gate electrode, forming an oxide film to cover the semiconductor substrate, the first gate electrode, the second gate electrode, the first sidewall and the second sidewall, forming a resist above the oxide film to cover the first region, removing the oxide film in the second region by etching the oxide film with the resist serving as a mask, removing the resist, and executing a plasma process by using a gas containing chlorine with respect to the semiconductor substrate and the oxide film in the first region.

10 Claims, 21 Drawing Sheets

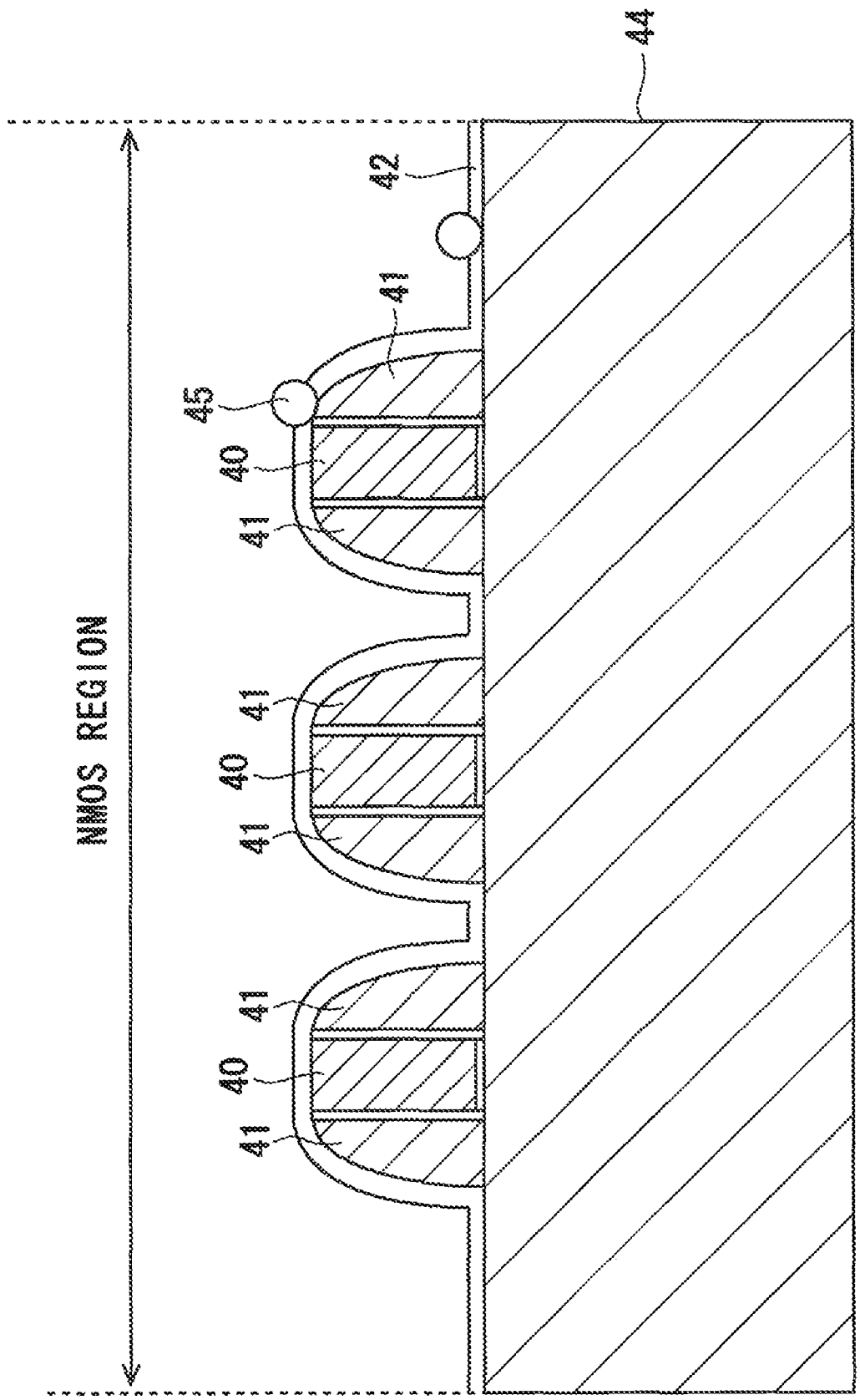

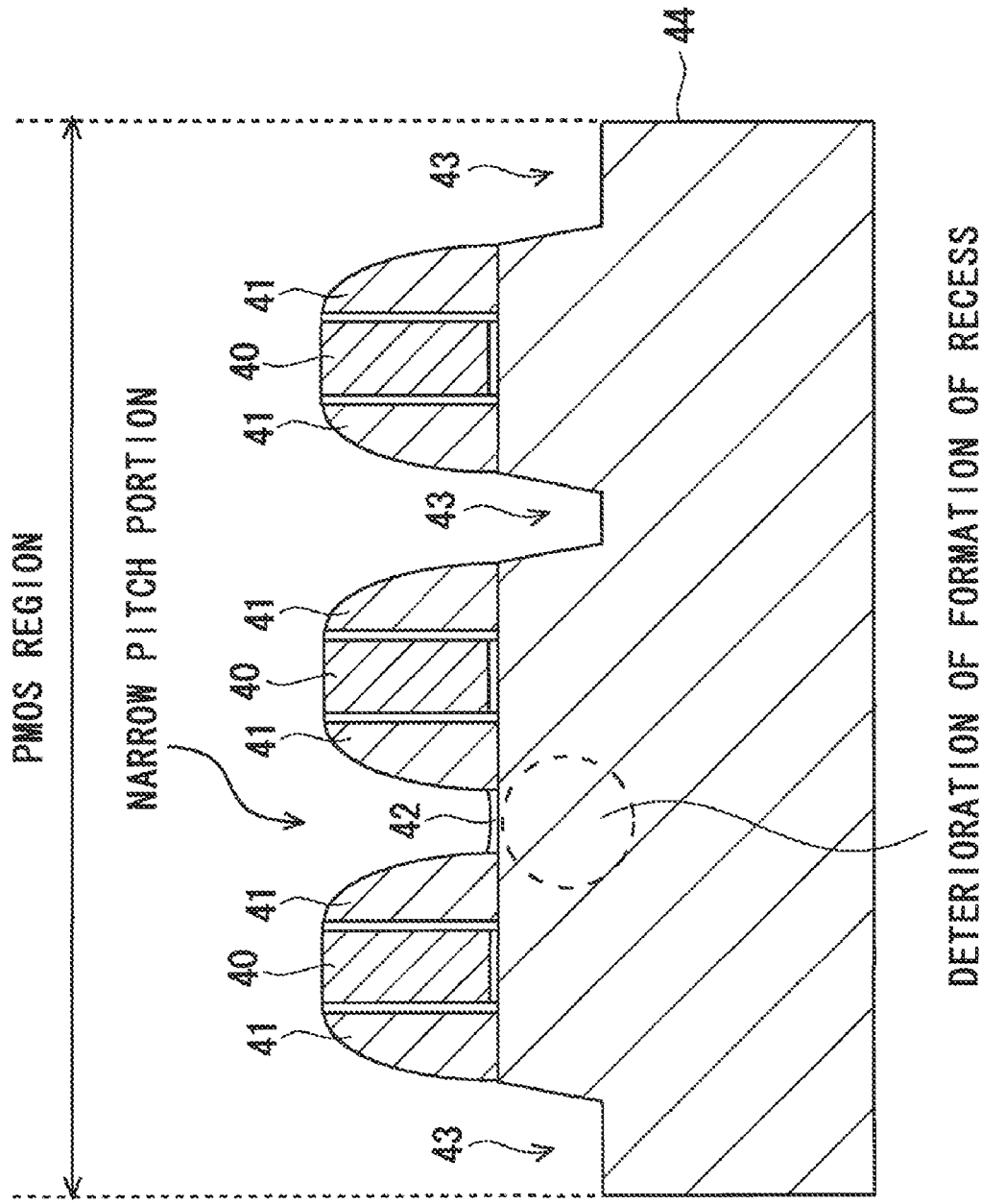

METHOD OF MANUFACTURING SEMICONDUCTOR DEVICE

CROSS-REFERENCE TO RELATED APPLICATIONS

This application is based upon and claims the benefit of priority of the prior Japanese Patent Application No. 2010-090771 filed on Apr. 9, 2010, the entire contents of which are incorporated herein by reference.

FIELD

The embodiment relates to a method of manufacturing a semiconductor device.

BACKGROUND

A MOS (Metal Oxide Semiconductor) field effects transistor (MOSFET) adopts an embedded SiGe (eSiGe) structure in which a SiGe (silicon germanium) layer is embedded in a source/drain region of a p-channel MOSFET (PMOSFET). A lattice constant of SiGe is larger than a lattice constant of Si, and hence a compressive strain is applied to a channel region sandwiched in between the source/drain regions in which the SiGe layer is embedded. In this case, a Hall mobility of the channel region is improved with the result that a current drive capability of PMOSFET rises, thereby enabling an improvement of characteristics of PMOSFET to be realized.

For example, an oxide film is grown as an insulation film by CVD (Chemical Vapor Deposition) on a silicon substrate, and the silicon substrate is etched with the oxide film serving as a mask, thereby forming a recess (recess well) in the surface of the silicon substrate exposed from the oxide film. Then, the SiGe layer is selectively epitaxially-grown in the recess, thus forming eSiGe structure in the silicon substrate.
Japanese Laid-open Patent Publication No. 2009-094225

SUMMARY

According to an aspect of the embodiment, a method of manufacturing a semiconductor device, comprising, forming a first gate electrode in a first region of a semiconductor substrate and forming a second gate electrode in a second region of the semiconductor substrate, forming a first sidewall along a lateral wall of the first gate electrode and forming a second sidewall along a lateral wall of the second gate electrode, forming an oxide film so as to cover the semiconductor substrate, the first gate electrode, the second gate electrode, the first sidewall and the second sidewall, forming a resist above the oxide film so as to cover the first region of the semiconductor substrate, removing the oxide film in the second region of the semiconductor substrate by etching the oxide film with the resist serving as a mask, removing the resist, and executing a plasma process by using a gas containing chlorine with respect to the semiconductor substrate and the oxide film in the first region of the semiconductor substrate.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF THE DRAWINGS

FIG. 18 is a sectional view of the semiconductor device according to the example of the related art.

FIG. 21 is a sectional view of the semiconductor device according to the example of the related art.

DESCRIPTION OF EMBODIMENT

In the case of forming a recess in a PMOS region (which is a region where PMOSFET is formed), before forming the recess in the surface of a silicon substrate, an oxide film in the PMOS region is removed beforehand. The removal of the oxide film in the PMOS region generally includes using dry etching. Such a problem exists that the oxide film in the PMOS region is not completely removed and the recess taking a desired shape is not formed on the surface of the silicon substrate due to a partial residual of the oxide film in the PMOS region.

Figure 17A:
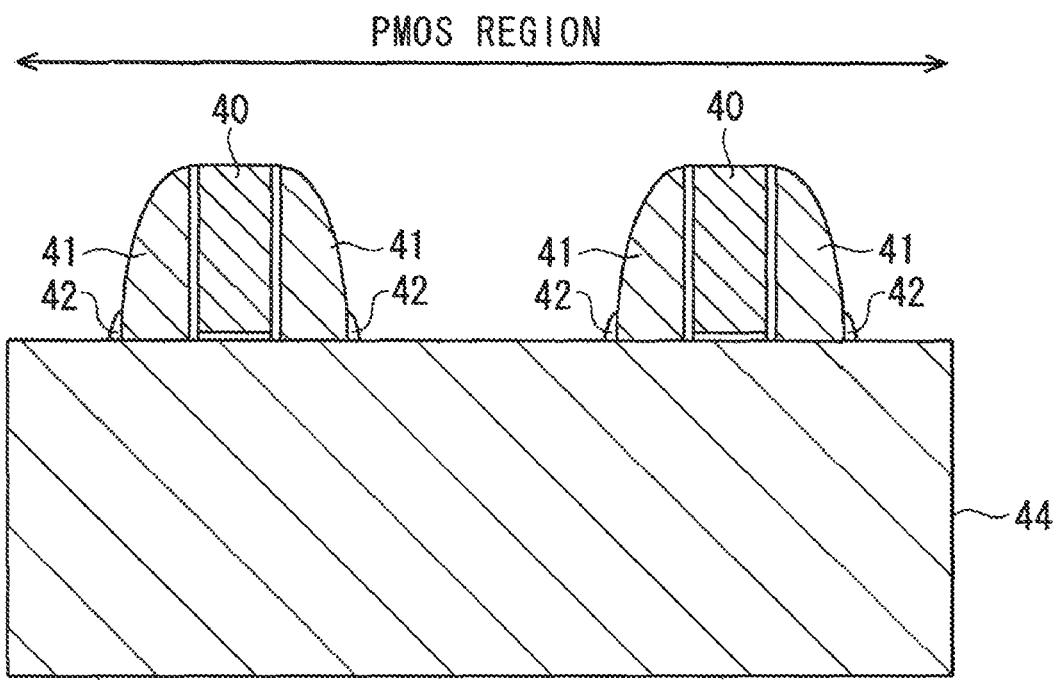
FIGS. 17A and 17B are a sectional view of a semiconductor device according to an example of the related art.
Figure 17B:
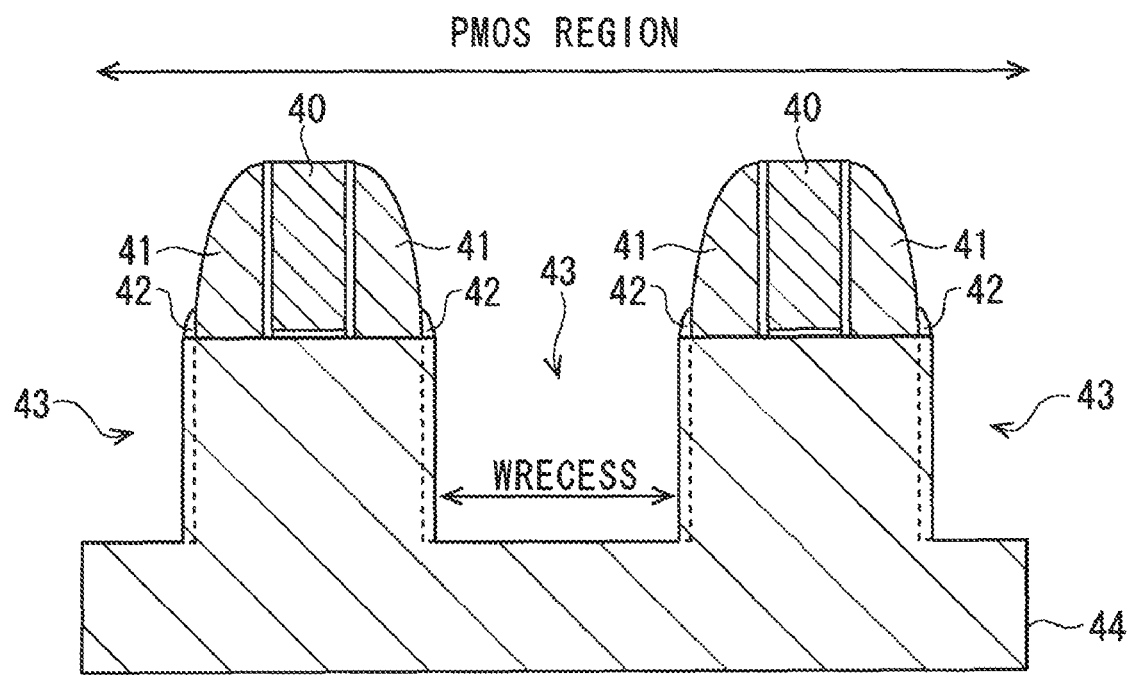

For instance, as illustrated in FIG. 17A, if a part of an oxide film 42 remains along the verge of a sidewall 41 formed on a lateral wall of a gate electrode 40 in the PMOS region, as illustrated in FIG. 17B, a recess 43 taking a desired shape is not formed in the surface of a silicon substrate 44. A dotted line depicted in FIG. 17B indicates a position of the recess 43 formed in the case of completely removing an oxide film 42. As affected by dispersion in shape of the sidewall 41, dispersion in size of the oxide film 42 remaining along the sidewall 41 occurs, which leads to occurrence of dispersion in width (Wrecess) of the recess 43. The dispersion in width of the recess 43 causes dispersion in width of the SiGe layer embedded in the recess 43. This results in occurrence of dispersion in magnitude of the compressive strain applied to the channel region, and consequently dispersion is caused also in characteristics of PMOSFET.

After forming a pocket region and an extension region on a silicon substrate 44, if high temperature processing at 600° C. or higher is conducted on the occasion of forming the eSiGe structure in the silicon substrate 44, diffusion of an impurity is induced, and hence the high temperature processing at 600° C. or higher is not preferable. It is therefore preferable that a temperature at which the oxide film 42 is grown on the silicon substrate 44 is set less than 600° C.

The oxide film 42 formed on the silicon substrate 44 by low-temperature CVD has, however, a low resistance against hydrofluoric acid. If the oxide film 42 has a small film thickness, such a problem arises that the oxide film 42 in an NMOS region (which is a region where n-channel MOSFET is formed) is also removed on the occasion of removing a natural oxide film on the surface of the recess 43 by a wet process using the hydrofluoric acid. As illustrated in FIG. 18, if the oxide film 42 has the small film thickness, a SiGe layer 45 is formed in a position where the oxide film 42 in the NMOS region is removed.

Figure 19:
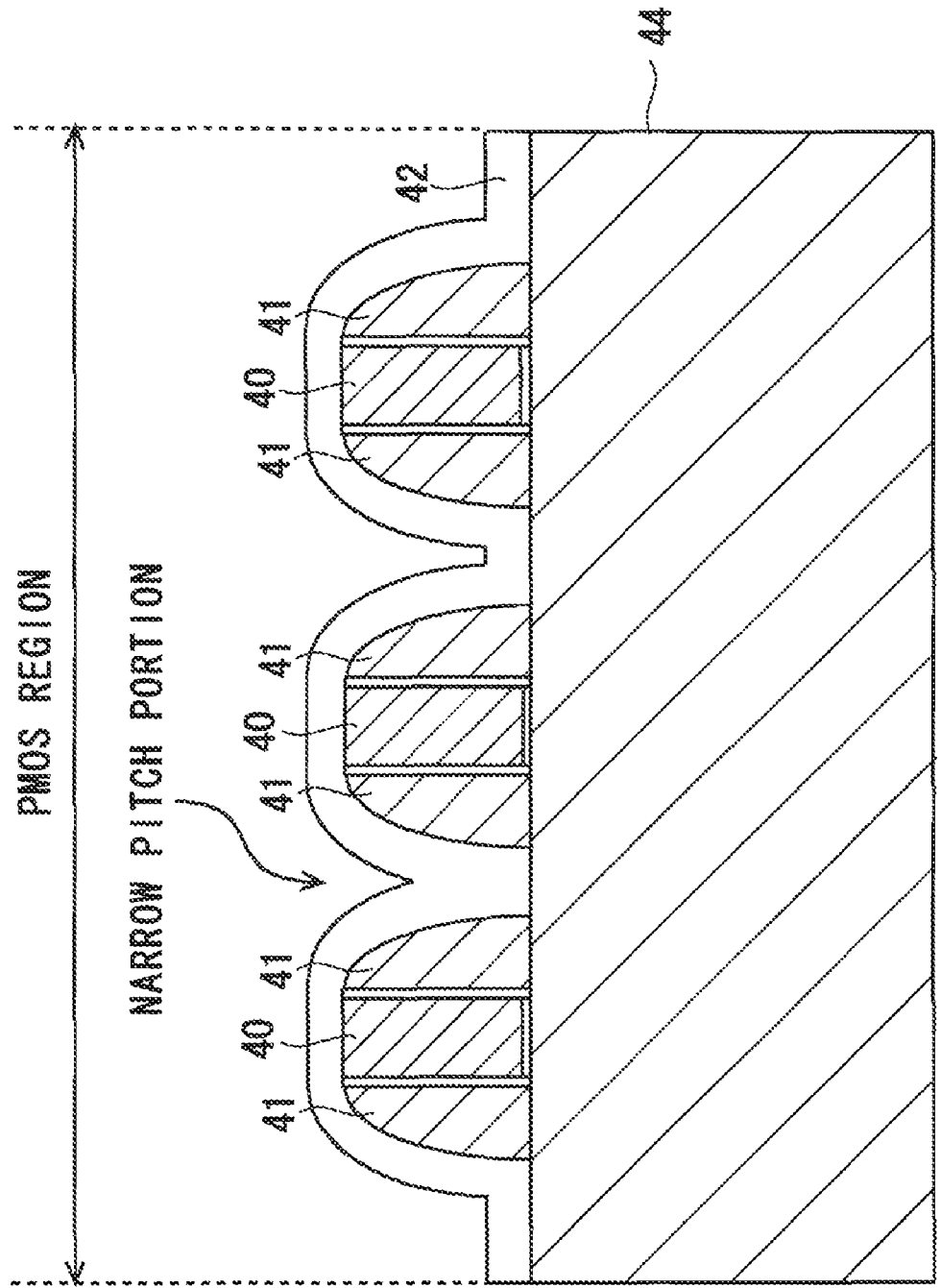
FIG. 19 is a sectional view of the semiconductor device according to the example of the related art.

Whereas if the oxide film 42 has a large film thickness, the oxide film 42 is embedded in a narrow pitch portion of the PMOS region. The narrow pitch portion is a portion in which a distance between PMOSFETs formed adjacent to each other is relatively short. As illustrated in FIG. 19, if the oxide film 42 has the large film thickness, the oxide film 42 is embedded in the narrow pitch portion of the PMOS region. As the distance between the PMOSFETs formed adjacent to each other gets shorter, the oxide film 42 gets easier to be embedded in between the PMOSFETs formed adjacent to each other.

Figure 20:
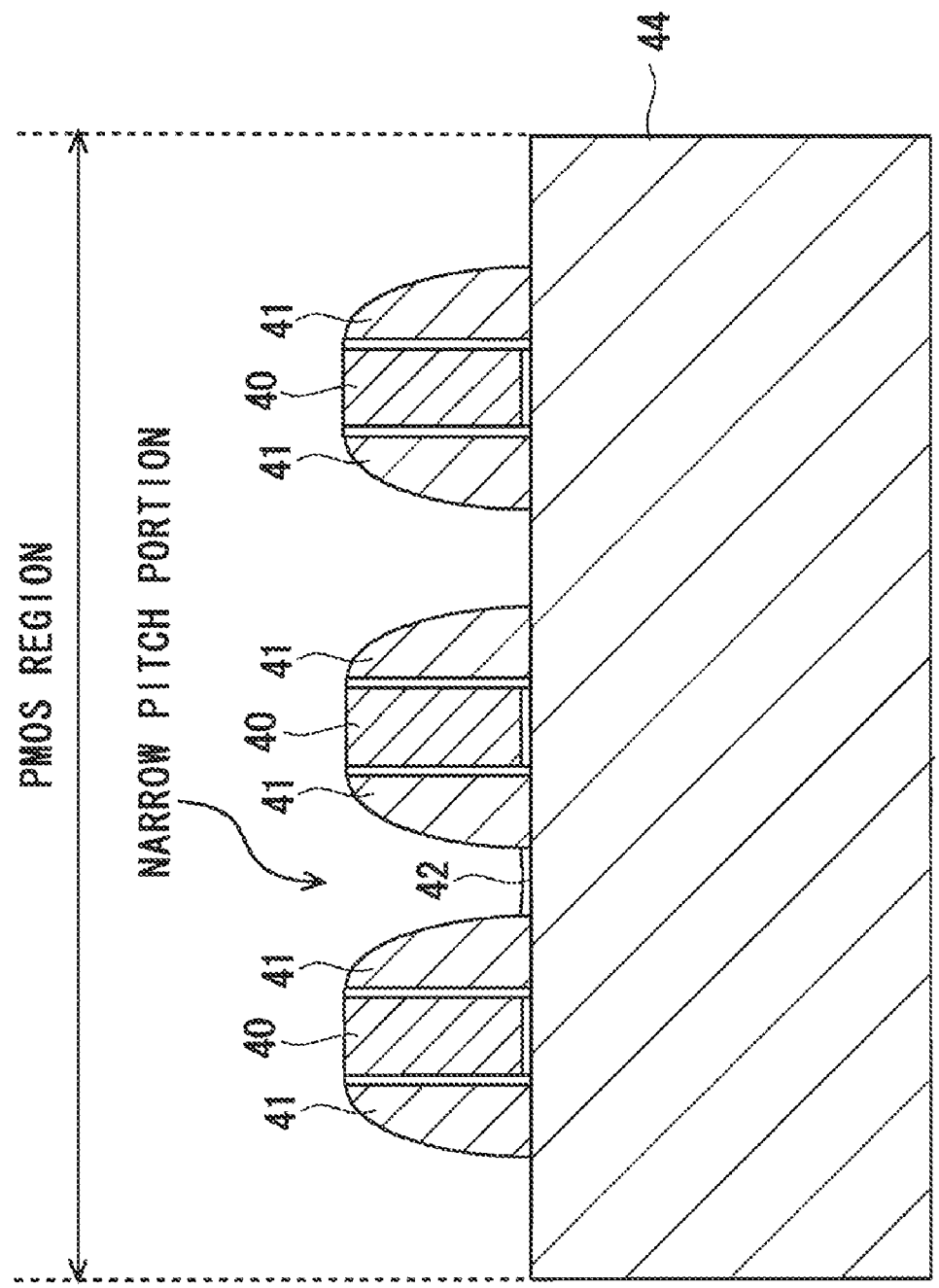
FIG. 20 is a sectional view of the semiconductor device according to the example of the related art.

If the oxide film 42 is embedded in between the PMOSFETs formed adjacent to each other, on the occasion of removing the oxide film 42 in the PMOS region by the dry etching, the oxide film 42 can not be completely removed. As depicted in FIG. 20, the oxide film 42 between the PMOSFETs formed adjacent to each other is not completely removed but remains between the PMOSFETs formed adjacent to each other.

The oxide film 42 remaining between the PMOSFETs formed adjacent to each other serves as a mask for forming the recess 43 in the silicon substrate 44 by the dry etching. Therefore, the recess 43 is not formed in the silicon substrate 44 just under the oxide film 42, with the result that the formation of the recess in the silicon substrate 44 is deteriorated. FIG. 21 is a sectional view of the semiconductor device in the case where the formation of the recess in the silicon substrate 44 is deteriorated. As illustrated in FIG. 21, the recess 43 is not formed in the silicon substrate 44 just under the oxide film 42 remaining between the PMOSFETs formed adjacent to each other, with the result that the formation of the recess in the silicon substrate 44 is deteriorated.

Figure 1:
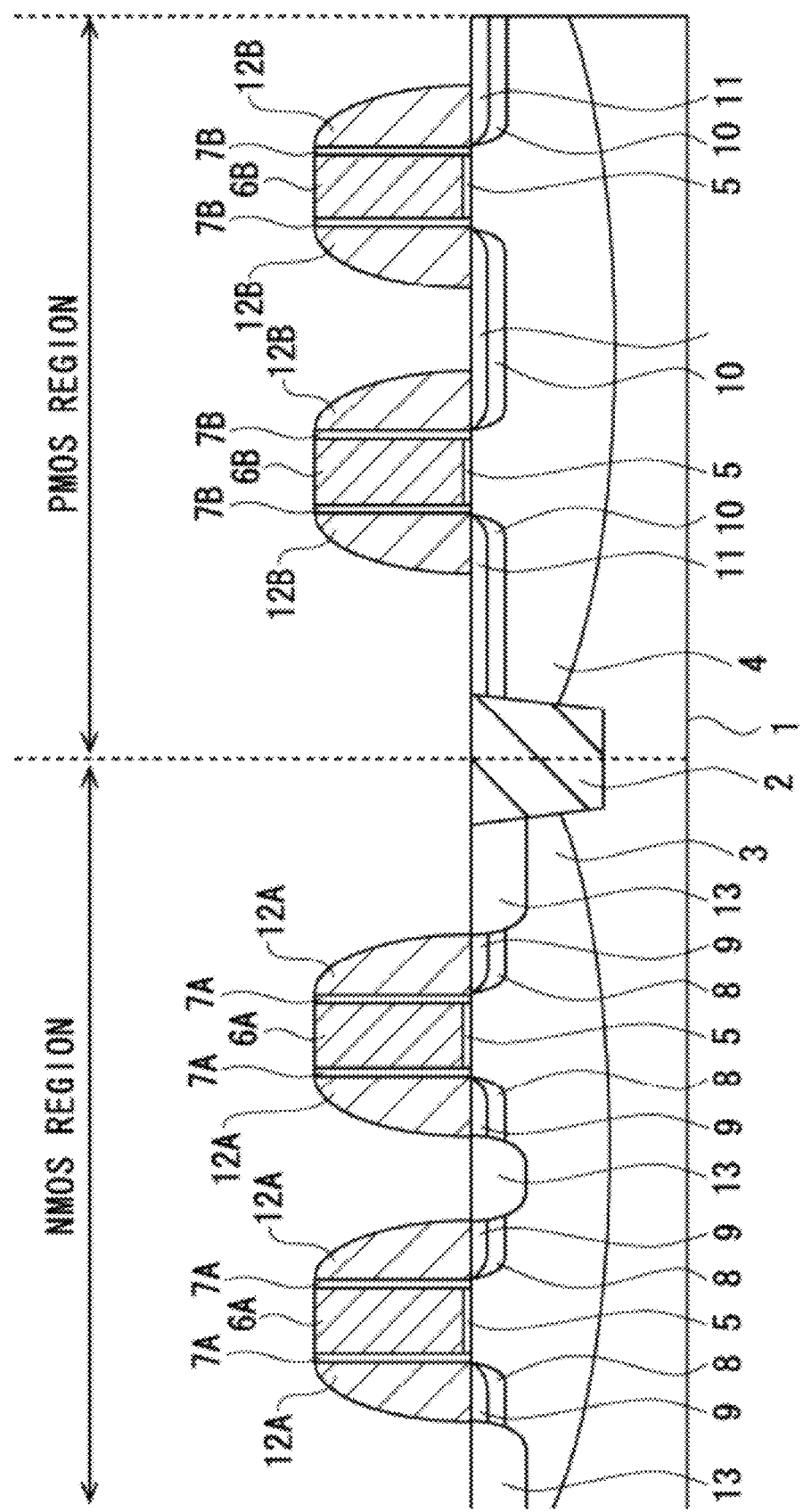
FIG. 1 is a sectional view (part 1) of a semiconductor device according to an embodiment.

An embodiment for solving the problems described above will hereinafter be discussed with reference to the drawings. To begin with, steps till the semiconductor device illustrated in FIG. 1 is manufactured will be described. In a method of manufacturing the semiconductor device according to the embodiment, at first, an element isolation film 2 taking an STI (Shallow Trench Isolation) structure is formed on the silicon (semiconductor) substrate 1.

The element isolation film 2 is formed as follows. To start with, a photo resist film is formed on the silicon substrate 1 by a spin coating method, and the photo resist film undergoes patterning by photolithography, thereby forming a resist on the silicon substrate 1. Next, with the resist serving as a mask, an element isolation trench is formed in the silicon substrate 1 by dry etching. Thereafter, the resist is removed by an asking process. Subsequently, based on a CVD (Chemical Vapor Deposition) method, a silicon oxide film is embedded in the element isolation trench formed in the silicon substrate 1 and is also deposited on the silicon substrate 1.

Then, the silicon oxide film on the silicon substrate 1 is flattened by a CMP (Chemical Mechanical Polishing) method, and the element isolation film 2 is formed on the silicon substrate 1. The formation of the element isolation film 2 on the silicon substrate 1 defines (isolates) an NMOS region (which a region where an n-channel MOSFET is formed) and a PMOS region (which a region where a p-channel MOSFET is formed), respectively.

Next, the photo resist film is formed on the silicon substrate 1 by the spin coating method, and undergoes the patterning by the photolithography, thereby forming the resist in a way that covers the PMOS region. Then, with the PMOS region's resist serving as the mask, e.g., boron (B) are implanted into the NMOS region of the silicon substrate 1 by an ion implantation method, thereby forming a p-well 3 in the silicon substrate 1.

Subsequently, the resist in the PMOS region is removed by the ashing process. Then, the photo resist film is formed on the silicon substrate 1 by the spin coating method, and the resist is formed so as to cover the NMOS region by the photolithography. Next, with the NMOS region's resist serving as the mask, e.g., phosphorus (P) are implanted into the PMOS region of the silicon substrate 1 by the ion implantation method, thereby forming an n-well 4 in the silicon substrate 1. Next, the resist in the NMOS region is removed by the asking process.

Then, a gate insulation film 5 is formed on the silicon substrate 1. The gate insulation film 5 may involve using, for example, an oxynitride film or a high dielectric constant (High-k) insulation film. Next, polysilicon is deposited on the gate insulation film 5 by the CVD method. Amorphous silicon as a substitute for the polysilicon may be deposited on the gate insulation film 5. Subsequently, the photo resist film is formed on the polysilicon by the spin coating method and undergoes the patterning by the photolithography, thereby forming the resist in a way that covers the polysilicon in the PMOS region. Then, with the resist on the polysilicon in the PMOS region serving as the mask, i.e., n-type impurities are implanted into the polysilicon in the NMOS region by the ion implantation method.

Then, the resist on the polysilicon in the PMOS region is removed by the ashing process. Next, the photo resist film is formed on the polysilicon by the spin coating method and undergoes the patterning by the photolithography, thereby forming the resist in a way that covers the polysilicon in the NMOS region. Subsequently, with the resist on the polysilicon in the NMOS region serving as the mask, i.e., p-type impurities are implanted into the polysilicon in the PMOS region by the ion implantation method.

Then, the resist covering the polysilicon in the NMOS region is removed by the ashing process. A thermal treatment such as spike annealing may be conducted as the necessity may arise in order to accelerate the diffusions of the n-type impurity and the p-type impurity implanted into the polysilicon.

Next, the photo resist film is formed on the polysilicon by the spin coating method and undergoes the patterning by the photolithography, thereby forming the resist for a gate electrode on the polysilicon. Subsequently, anisotropic dry etching is carried out by using the resist for the gate electrode as the mask, whereby a first gate electrode 6A and a second gate electrode 6B are formed on an upper portion of the silicon substrate 1. The first gate electrode 6A is formed in the NMOS region, while the second gate electrode 6B is formed in the PMOS region.

Then, the resist for the gate electrode is removed by the ashing process. Next, a first thin sidewall 7A is formed along the lateral wall of the first gate electrode 6A, and a second thin sidewall 7B is formed along the lateral wall of the second gate electrode 6B. The first thin sidewall 7A and the second thin sidewall 7B are formed by, e.g., forming the oxide film over the entire surface of the silicon substrate 1 and etching back the oxide film. In place of the oxide film, a nitride film or a stacked film of the oxide film and the nitride film may be formed over the entire surface of the silicon substrate 1. The embodiment exemplifies the example of forming the first thin sidewall 7A and the second thin sidewall 7B, however, the formation of the first thin sidewall 7A and the second thin sidewall 7B may also be omitted.

Subsequently, the photo resist film is formed on the silicon substrate 1 by the spin coating method and undergoes the patterning by the photolithography, thereby forming the resist in the PMOS region. Next, pocket implantation and extension implantation (of the impurities) into the NMOS region of the silicon substrate 1 are executed in a way that uses the first gate electrode 6A, the first thin sidewall 7A and the resist in the PMOS region as the masks. Thus, the first thin sidewall 7A functions as an offset spacer for performing the pocket implantation and the extension implantation into the NMOS region of the silicon substrate 1. In the case of omitting the step of forming the first thin sidewall 7A, the pocket implantation and the extension implantation into the NMOS region of the silicon substrate 1 are carried out by using the first gate electrode 6A and the resist in the PMOS region as the masks.

The pocket implantation into the NMOS region of the silicon substrate 1 is carried out by implanting pocket impurities into the NMOS region of the silicon substrate 1 by the ion implantation method. The pocket impurity is a p-type impurity such as B (boron) and In (indium).

The extension implantation into the NMOS region of the silicon substrate 1 is performed by implanting extension impurities into the NMOS region of the silicon substrate 1 by the ion implantation method. The extension impurity is an n-type impurity such as P (phosphorus), As (arsenic) and Sb (stibium: antimony).

The pocket impurities are ion-implanted into the NMOS region of the silicon substrate 1, whereby a pocket region 8 is formed in the NMOS region of the silicon substrate 1. The extension impurities are ion-implanted into the NMOS region of the silicon substrate 1, whereby an extension region 9 is formed in the NMOS region of the silicon substrate 1. The ion-implantation of the pocket impurities into the NMOS region of the silicon substrate is conducted down to a deeper position than by the ion-implantation of the extension impurities into the NMOS region of the silicon substrate 1. Therefore, the pocket region 8 is formed down to the position deeper than the extension region 9.

Next, the resist in the PMOS region of the silicon substrate 1 is removed by the asking process. Subsequently, the photo resist film is formed on the silicon substrate 1 by the spin coating method and undergoes the patterning by the photolithography, thereby forming the resist in the NMOS region. Then, the pocket implantation and the extension implantation into the PMOS region of the silicon substrate 1 are executed in a way that uses the second gate electrode 6B, the second thin sidewall 7B and the resist in the NMOS region as the masks. Thus, the second thin sidewall 7B functions as the offset spacer for performing the pocket implantation and the extension implantation into the PMOS region of the silicon substrate 1. In the case of omitting the step of forming the second thin sidewall 7B, the pocket implantation and the extension implantation into the PMOS region of the silicon substrate 1 are carried out by using the second gate electrode 6B and the resist in the NMOS region as the masks.

The pocket implantation into the PMOS region of the silicon substrate 1 is performed by implanting the pocket impurities into the PMOS region of the silicon substrate 1 by the ion implantation method. The pocket impurity is the n-type impurity such as P (phosphorus), As (arsenic) and Sb (stibium: antimony).

The extension implantation into the PMOS region of the silicon substrate 1 is carried out by implanting the extension impurities into the PMOS region of the silicon substrate 1 by the ion implantation method. The extension impurity is the p-type impurity such as B (boron) and In (indium).

The pocket impurities are ion-implanted into the PMOS region of the silicon substrate 1, thereby forming a pocket region 10 in the PMOS region of the silicon substrate 1. The extension impurities are ion-implanted into the PMOS region of the silicon substrate 1, thereby forming an extension region 11 in the PMOS region of the silicon substrate 1. The ion-implantation of the pocket impurities into the PMOS region of the silicon substrate is conducted down to a deeper position than by the ion-implantation of the extension impurities into the PMOS region of the silicon substrate 1. Therefore, the pocket region 10 is formed down to the position deeper than the extension region 11.

Next, the resist in the NMOS region of the silicon substrate 1 is removed by the asking process. Subsequently, a first sidewall 12A is formed along the lateral wall of the first thin sidewall 7A, and a second sidewall 12 is formed along the lateral wall of the second thin sidewall 7B. The first sidewall 12A and the second sidewall 12B are formed by growing the oxide film over the entire surface of the silicon substrate 1 and etching back the oxide film. In place of the oxide film, the nitride film or the stacked film of the oxide film and the nitride film may be formed over the entire surface of the silicon substrate 1.

Then, the photo resist film is formed on the silicon substrate 1 by the spin coating method and undergoes the patterning by the photolithography, thereby forming the resist in the PMOS region. Next, source/drain implantation into the NMOS region of the silicon substrate 1 is carried out in a way that uses the first gate electrode 6A, the first thin sidewall 7A, the first sidewall 12A and the resist in the PMOS region as the masks. Thus, the first sidewall 12A functions as the offset spacer for performing the source/drain implantation into the NMOS region of the silicon substrate 1. In the case of omitting the step of forming the first thin sidewall 7A, the source/drain implantation into the NMOS region of the silicon substrate 1 is executed by using the first gate electrode 6A, the first sidewall 12A and the resist in the PMOS region as the masks.

The source/drain implantation into the NMOS region of the silicon substrate 1 is executed by performing the ion-implantation of source/drain impurities into the NMOS region of the silicon substrate 1. The source/drain impurity is the n-type impurity such as P (phosphorus) and As (arsenic). The source/drain implantation into the NMOS region of the silicon substrate 1 is carried out by conducting the ion-implantation of the source/drain impurities into the NMOS region of the silicon substrate 1, whereby a source/drain region 13 is formed in the NMOS region of the silicon substrate 1. Note that the source/drain region 13 may also be formed in a step executed afterward.

Figure 2:
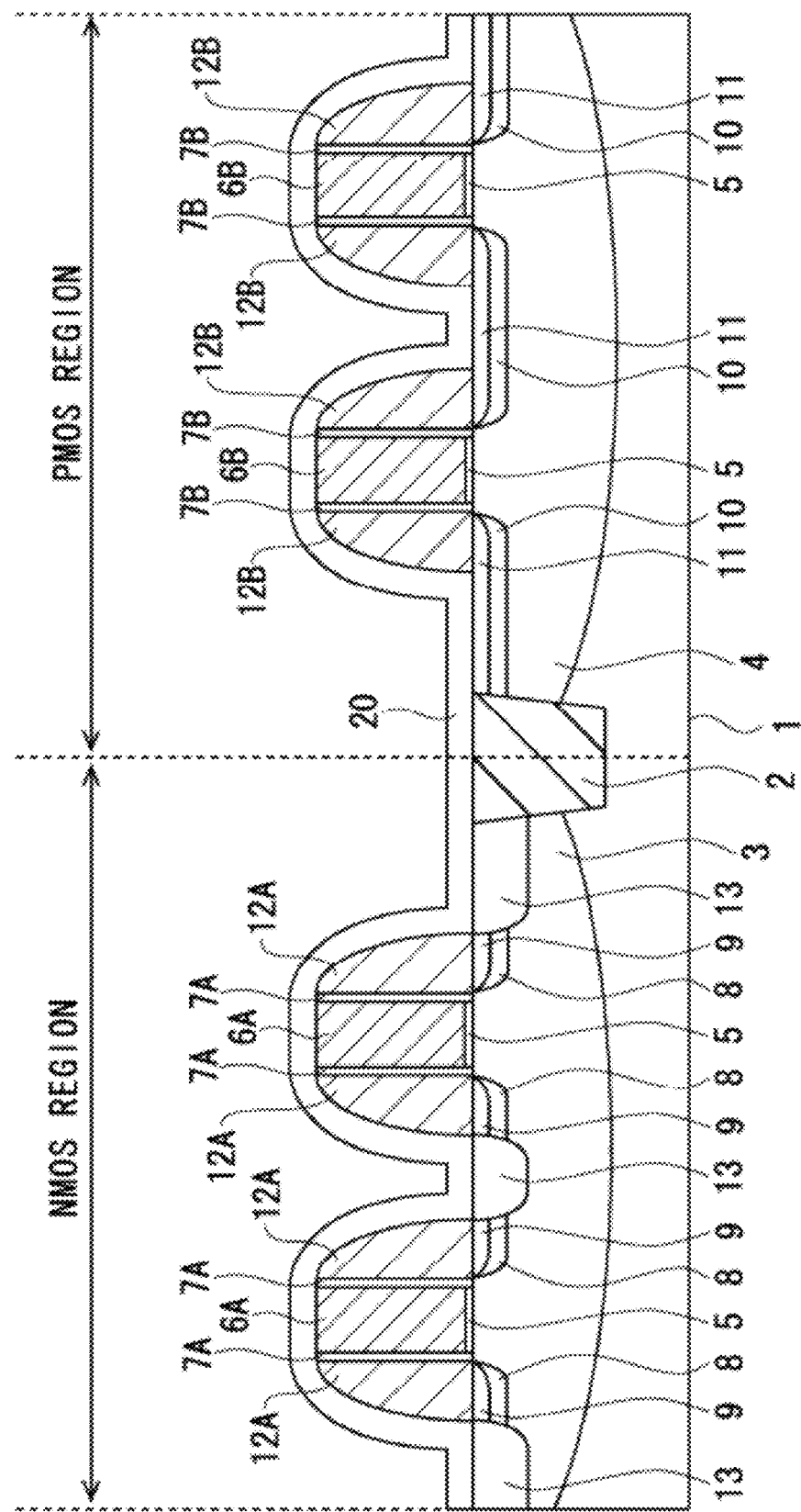
FIG. 2 is a sectional view (part 2) of the semiconductor device according to the embodiment.

Next, an oxide film 20 is formed on or above the silicon substrate 1 by an LP-CVD (Low Pressure Chemical Vapor Deposition) method or an ALD (Atomic Layer Deposition) method. A film thickness of the oxide film 20 is on the order of, e.g., 20 nm. FIG. 2 is a sectional view of the semiconductor device in the case of forming the oxide film 20.

In the case of LP-CVD method, the silicon oxide film 20 may be formed under such conditions that a film growth temperature is set equal to or higher than 550° C. but equal to or lower than 600° C. and a pressure is set equal to or higher than 0.1 Pa but equal to or lower than 1000 Pa, in which raw gases are TEOS (tetraethoxysilane) and O$_2$ (oxygen). Further, the raw gases may be activated by remote plasma.

Moreover, in the case of the LP-CVD method, the silicon oxide film 20 may be formed under such conditions that the film growth temperature is set equal to or higher than 450° C. but equal to or lower than 600° C. and the pressure is set equal to or higher than 0.1 Pa but equal to or lower than 1000 Pa, in which the raw gases are BTBAS (Bis (tertiary-butylamino) silane) and O$_2$ (oxygen). Further, the raw gases may be activated by the remote plasma.

Furthermore, in the case of the ALD method, the silicon oxide film 20 may be formed under such conditions that the film growth temperature is set equal to or higher than 300° C. but equal to or lower than 600° C. and the pressure is set equal to or higher than 0.1 Pa but equal to or lower than 1000 Pa, in which the raw gases are TDMA (Tetra (dimethylamino) silane) and O$_3$ (ozone). Further, the raw gases may be activated by the remote plasma.

The oxide film 20 formed by use of the raw gases containing TEOS, BTBAS or TDMAS on the basis of the LP-CVD method or the ALD method is composed of SiO$_2$ containing SiH.

Figure 3:
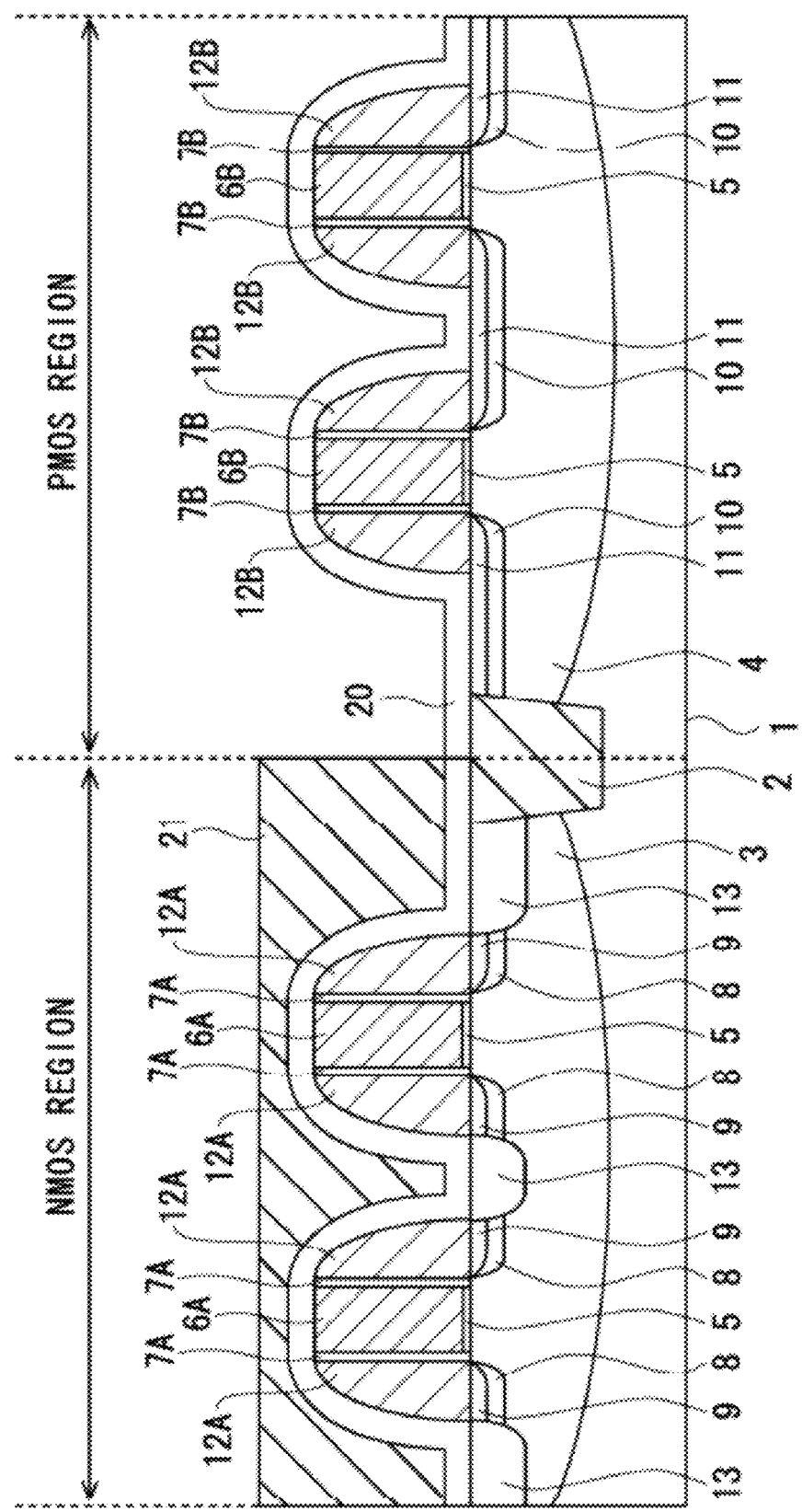
FIG. 3 is a sectional view (part 3) of the semiconductor device according to the embodiment.

Then, the photo resist film is formed on the oxide film 20 by the spin coating method and undergoes the patterning by the photolithography, thereby forming a resist 21 in a way that covers the NMOS region of the silicon substrate 1. FIG. 3 is a sectional view of the semiconductor device in the case of forming the resist 21 in the NMOS region.

Next, with the NMOS region's resist 21 serving as the mask, the oxide film 20 in the PMOS region is removed by the dry etching. The dry etching may be done by employing a fluorocarbon gas such as CF$_4$, C$_4$F$_8$ or CHF$_3$. Further, the dry etching may be conducted by use of the fluorocarbon gas such as CF$_4$, C$_4$F$_8$ or CHF$_3$ as a main component to which Ar and O$_2$ are added.

Figure 4:
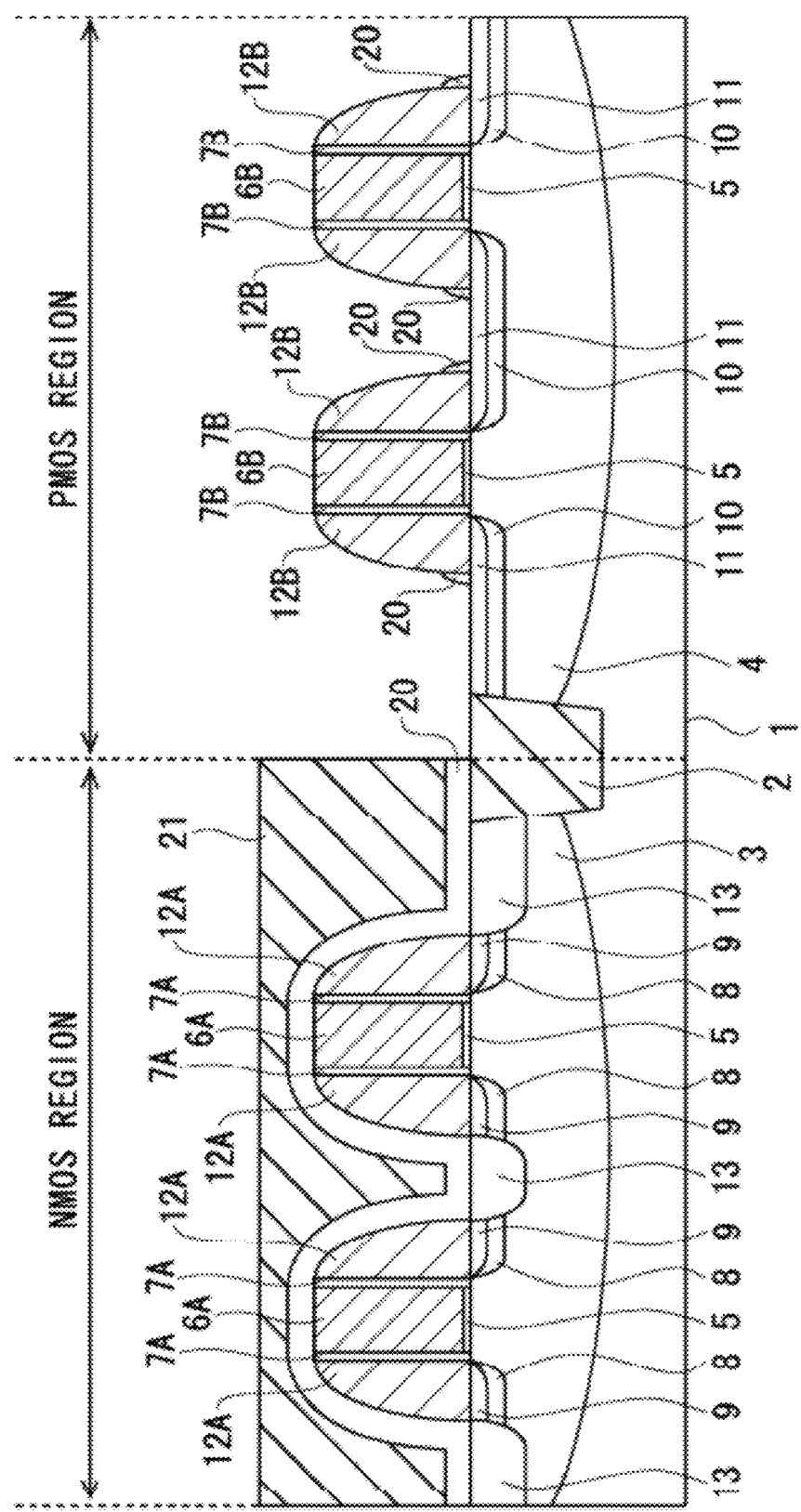
FIG. 4 is a sectional view (part 4) of the semiconductor device according to the embodiment.

FIG. 4 is a sectional view of the semiconductor device in the case of removing the oxide film 20 in the PMOS region. As illustrated in FIG. 4, in the PMOS region, a residue of the oxide film 20 is left in the periphery of a position where the second sidewall 12B gets into contact with the silicon substrate 1.

Figure 5:
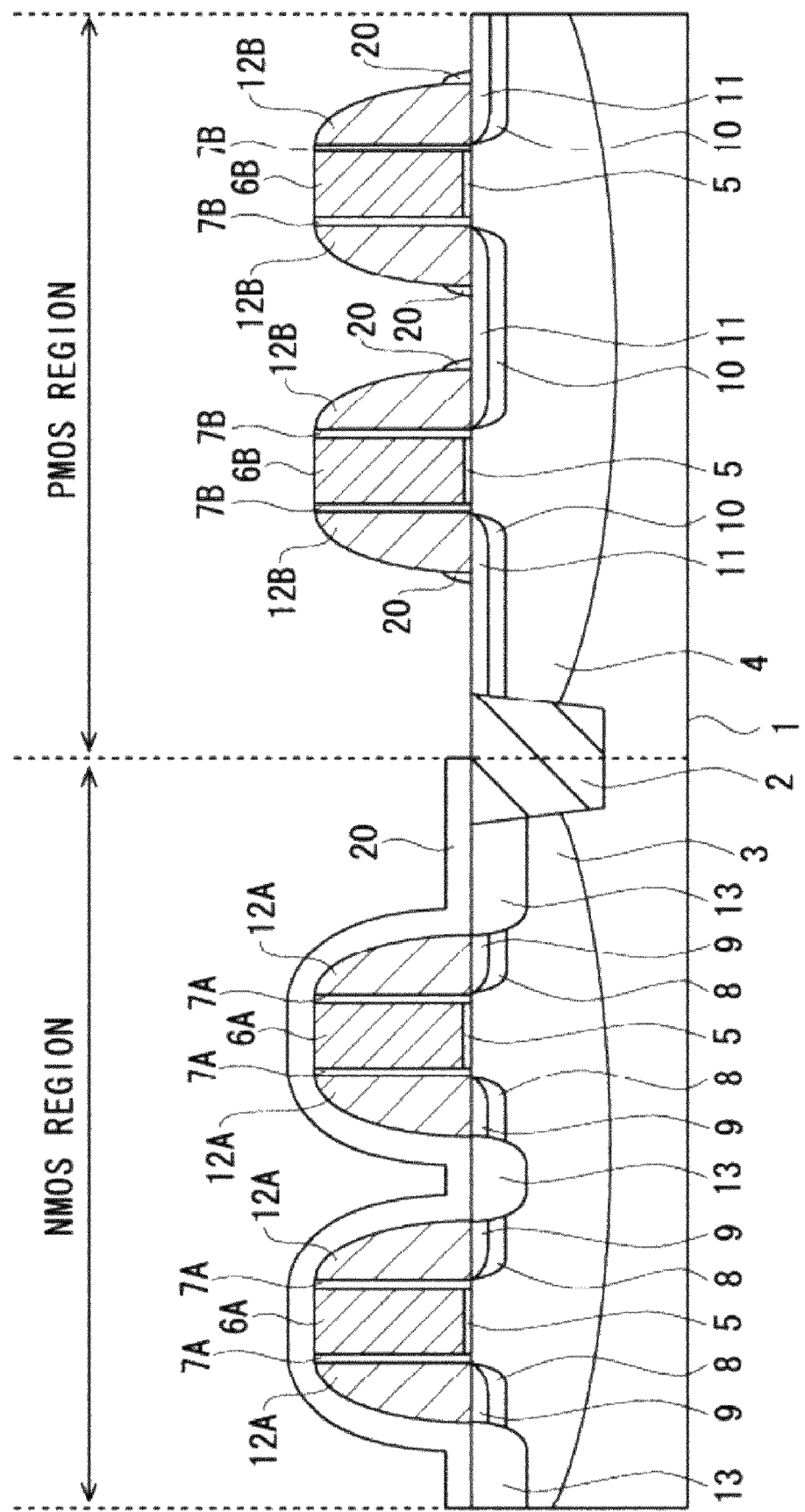
FIG. 5 is a sectional view (part 5) of the semiconductor device according to the embodiment.

Subsequently, the resist 21 is removed by the asking process. FIG. 5 is a sectional view of the semiconductor device in the case of removing the resist 21 in the NMOS region.

Then, a plasma process is performed by use of a gas containing Cl (chlorine) with respect to the silicon substrate 1 and the oxide film 20 in the NMOS region, in which a temperature of the substrate is set equal to or lower than 600° C. The plasma process is executed by use of the gas containing Cl, whereby the oxide film 20 in the NMOS region is densified and the resistance against the hydrofluoric acid of the oxide film 20 in the NMOS region is improved. Further, the plasma process may also be executed by use of the gas containing Cl and He (helium) with respect to the silicon substrate 1 and the oxide film 20 in a way that sets the substrate temperature at equal to or lower than 600° C. For example, Cl may also be added into a He atmospheric air.

Figure 6:
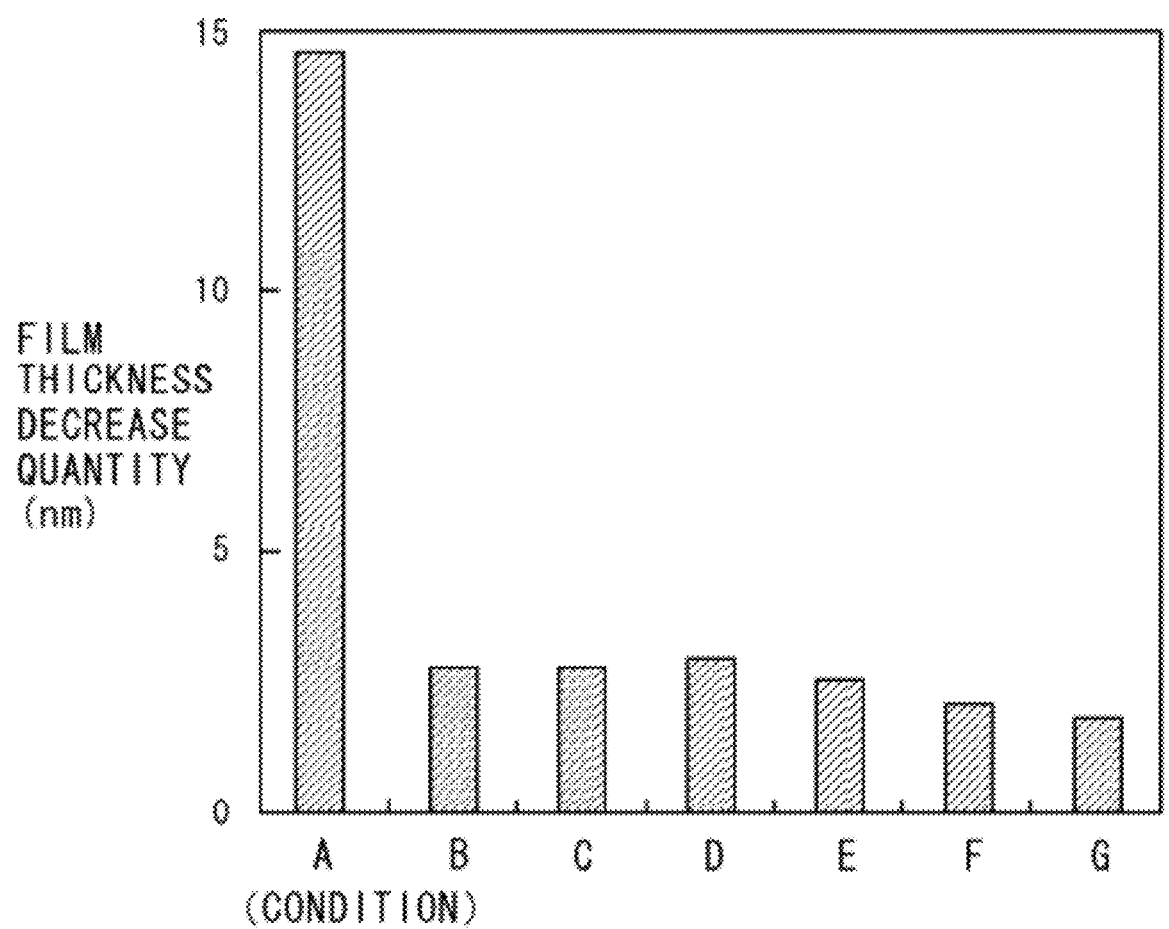
FIG. 6 is a graph illustrating a change in resistance against hydrofluoric acid with respect to an oxide film 20.

Herein, the improvement of the resistance against hydrofluoric acid of the oxide film 20 will be described. FIG. 6 is a graph illustrating a change in resistance against hydrofluoric acid of the oxide film 20. The axis of ordinate in FIG. 6 represents a decrease quantity (nm) of the film thickness of the oxide film 20 in the case of executing a hydrofluoric acid process for the oxide film 20. The axis of abscissa in FIG. 6 represents conditions of the plasma process. A condition A is that not the plasma process but the hydrofluoric acid process is performed for the oxide film 20. A condition B is that after conducting the plasma process for 30 sec by use of the He (helium) gas and the O$_2$ (oxygen) gas, the hydrofluoric acid process is carried out for the oxide film 20. A condition C is that after executing the plasma process for 60 sec by use of the He gas and the O$_2$ gas, the hydrofluoric acid process is performed with respect to the oxide film 20. A condition D is that after executing the plasma process for 240 sec by use of the He gas and the O$_2$ gas, the hydrofluoric acid process is performed with respect to the oxide film 20. A condition E is that after executing the plasma process for 30 sec by use of the He gas, the hydrofluoric acid process is conducted with respect to the oxide film 20. A condition F is that after executing the plasma process for 60 sec by use of the He gas, the hydrofluoric acid process is conducted with respect to the oxide film 20. A condition G is that after executing the plasma process for 240 sec by use of the He gas, the hydrofluoric acid process is conducted with respect to the oxide film 20. The plasma processes under the conditions B through G are executed by setting the substrate temperature at equal to or higher than 450° C. but equal to or lower than 500° C. Further, under the conditions A through G, the conditions of the hydrofluoric acid process are all the same.

As illustrated in FIG. 6, under the conditions B through G as compared with the condition A, the decrease quantity (nm) of the film thickness of the oxide film 20 is reduced down to approximately one-fifth. Namely, in the case of executing the plasma process by use of the He gas and the O$_2$ gas and in the case of performing the plasma process by employing the He gas, the resistance against hydrofluoric acid is improved. Moreover, there can be seen the improvement of resistance against hydrofluoric acid, which is equal to or greater than in the case of performing the plasma process by employing the He gas and in the case of executing the plasma process by use of the He gas and the O$_2$ gas.

Figure 7:
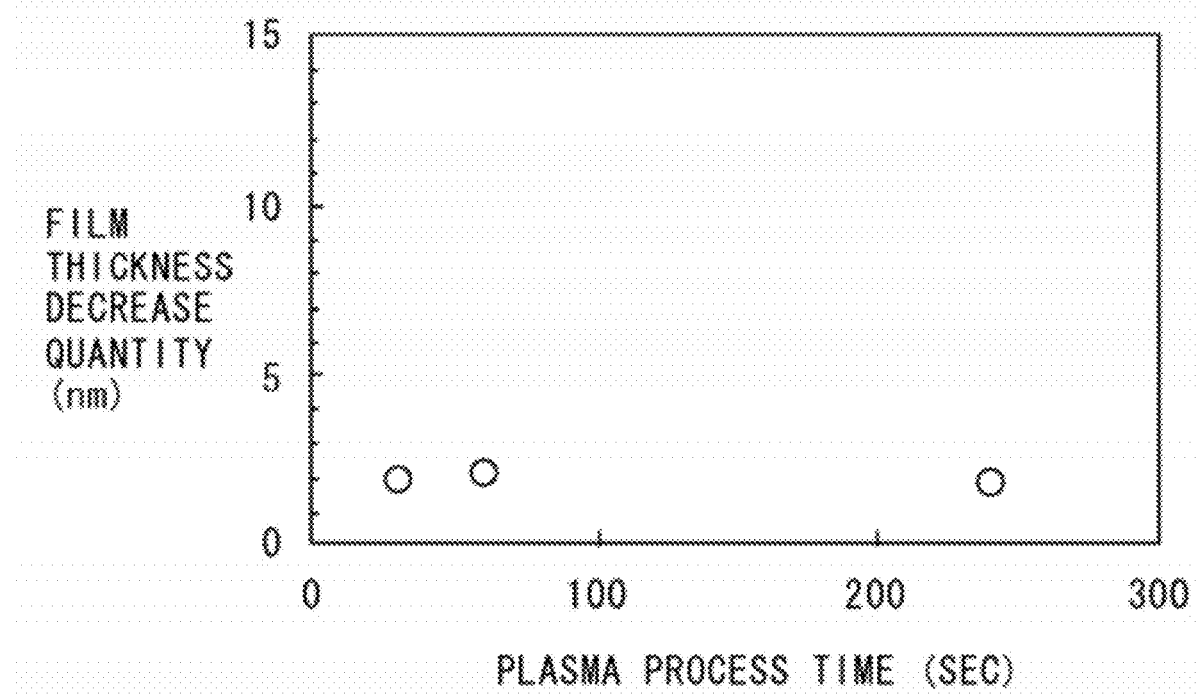
FIG. 7 is a graph illustrating a relation between a period of plasma process time and a decrease quantity (nm) of a film thickness of the oxide film 20.

FIG. 7 is a graph illustrating a relation between a period of plasma process time and the decrease quantity (nm) of the film thickness of the oxide film 20. The axis of ordinate in FIG. 7 represents the decrease quantity (nm) of the film thickness of the oxide film 20 in the case of executing the plasma process. An ellipsometer measures (a first measurement) the film thickness of the oxide film 20 after forming the oxide film 20 having the film thickness on the order of 10 nm, and measures (a second measurement) the film thickness of the oxide film 20 after executing the plasma process by use of the He gas. A numeric value obtained by subtracting the film thickness of the oxide film 20 based on the first measurement from the film thickness of the oxide film 20 based on the second measurement, is set as the decrease quantity (nm) of the film thickness of the oxide film 20. The axis of abscissa in FIG. 7 represents the plasma process time (sec) when executing the plasma process by use of the He gas.

The film thickness of the oxide film 20 is reduced by executing the plasma process in a way that uses the He gas. As illustrated in FIG. 7, the reduction in film thickness of the oxide film 20 is on the order of 2 nm. On the other hand, the decrease quantity (nm) of the film thickness of the oxide film 20 remains almost unchanged even by elongating the plasma process time. Namely, the decrease quantity (nm) of the film thickness of the oxide film 20 is fixed without depending on the length of the plasma process time. It is presumed from this result not that the decrease in film thickness of the oxide film 20 occurs due to the etching in the plasma process but that the film thickness of the oxide film 20 decreases by densifying the oxide film 20.

It is also presumed from the results given in FIGS. 6 and 7 that the resistance against hydrofluoric acid of the oxide film 20 is improved by densifying the oxide film 20. The oxide film 20 is considered to be densified because of such a behavior that He ions and radicals in the plasma state receive electrons from Si—H couplings contained in the oxide film 20 and H gets uncoupled from Si—H. An important factor for uncoupling H from Si—H is the plasma exhibiting high chemical reactivity in the high energy state, but the plasma raw material may not be limited to He. Herein, the He plasma exhibiting the low reactivity is employed, however, the reaction of uncoupling H from Si—H similarly advances also in the case of using the Cl plasma having the high reactivity. Accordingly, even in the case of executing the plasma process by use of the gas containing Cl, it is assumed that the resistance against hydrofluoric acid of the oxide film 20 is ameliorated.

Further, the surface of the silicon substrate 1 in the PMOS region is etched by performing the plasma process with the gas containing Cl, and the surface of the silicon substrate 1 in the PMOS region is thus cut. The surface of the silicon substrate 1 in the PMOS region is cut, whereby the residue of the oxide film 20 remaining on the silicon substrate 1 undergoes lift-off.

Figure 8:
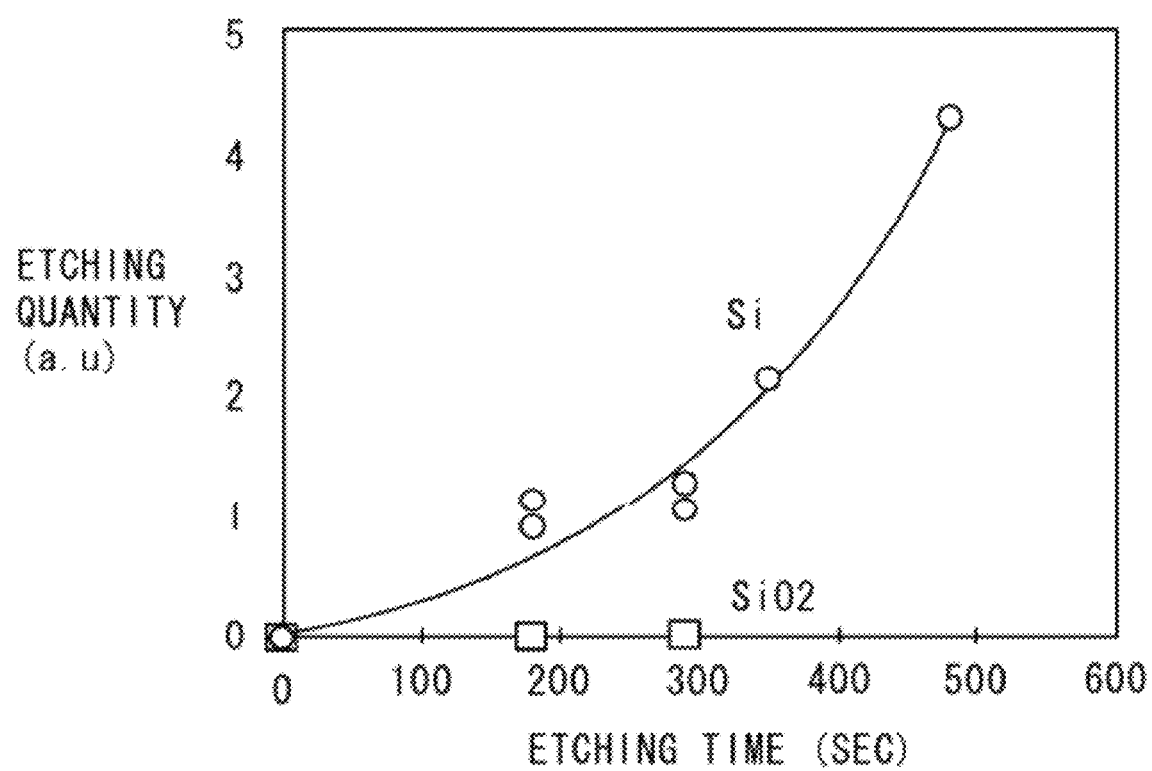
FIG. 8 is a graph illustrating a relation between an etching quantity of each of a silicon substrate 1 and the oxide film 20 and the etching time.

FIG. 8 is a graph indicating a relation between etching quantities of the silicon substrate 1 and of the oxide film 20 and a period of etching time. The axis of ordinate in FIG. 8 represents the etching quantities of the silicon substrate 1 and the oxide film 20. The etching quantities of the silicon substrate 1 and the oxide film 20 are calculated from the before-and-after etching shapes of the silicon substrate 1 and the oxide film 20 by employing a transmission electron microscope (TEM). The axis of abscissa in FIG. 8 indicates the etching time (sec). A circle (○) in FIG. 8 indicates the etching quantity of the silicon substrate 1, and a square (□) in FIG. 8 represents the etching quantity of the oxide film 20. The etching is carried out under about 2000 Pa as a total pressure by use of a mixed gas containing a $H_2$ (hydrogen) gas supply quantity of 20 slm and a HCl (hydrogen chloride) gas supply quantity of 45 sccm.

As illustrated in FIG. 8, the etching quantity of the silicon substrate 1 increases as the etching time elongates. On the other hand, as depicted in FIG. 8, the film thickness of the oxide film 20 does not decrease even when etched by use of the mixed gas of the $H_2$ gas and the HCl gas, and the etching quantity of the oxide film 20 does not increase even when the etching time elongates. Herein, though the mixed gas of the $H_2$ gas and the HCl gas is not set in the plasma state, however, if the mixed gas of the $H_2$ gas and the HCl gas is set in the plasma state, an assumption is that the reaction gets active and the etching quantity of the silicon substrate 1 further rises. Moreover, in the case of performing the etching by employing only the $H_2$ gas without using the HCl gas, none of the increase in etching quantities of the silicon substrate 1 and the oxide film 20 is seen. Accordingly, it is preferable that the silicon substrate 1 is etched by employing the gas containing at least Cl in order to cut the surface of the silicon substrate 1.

Figure 9:
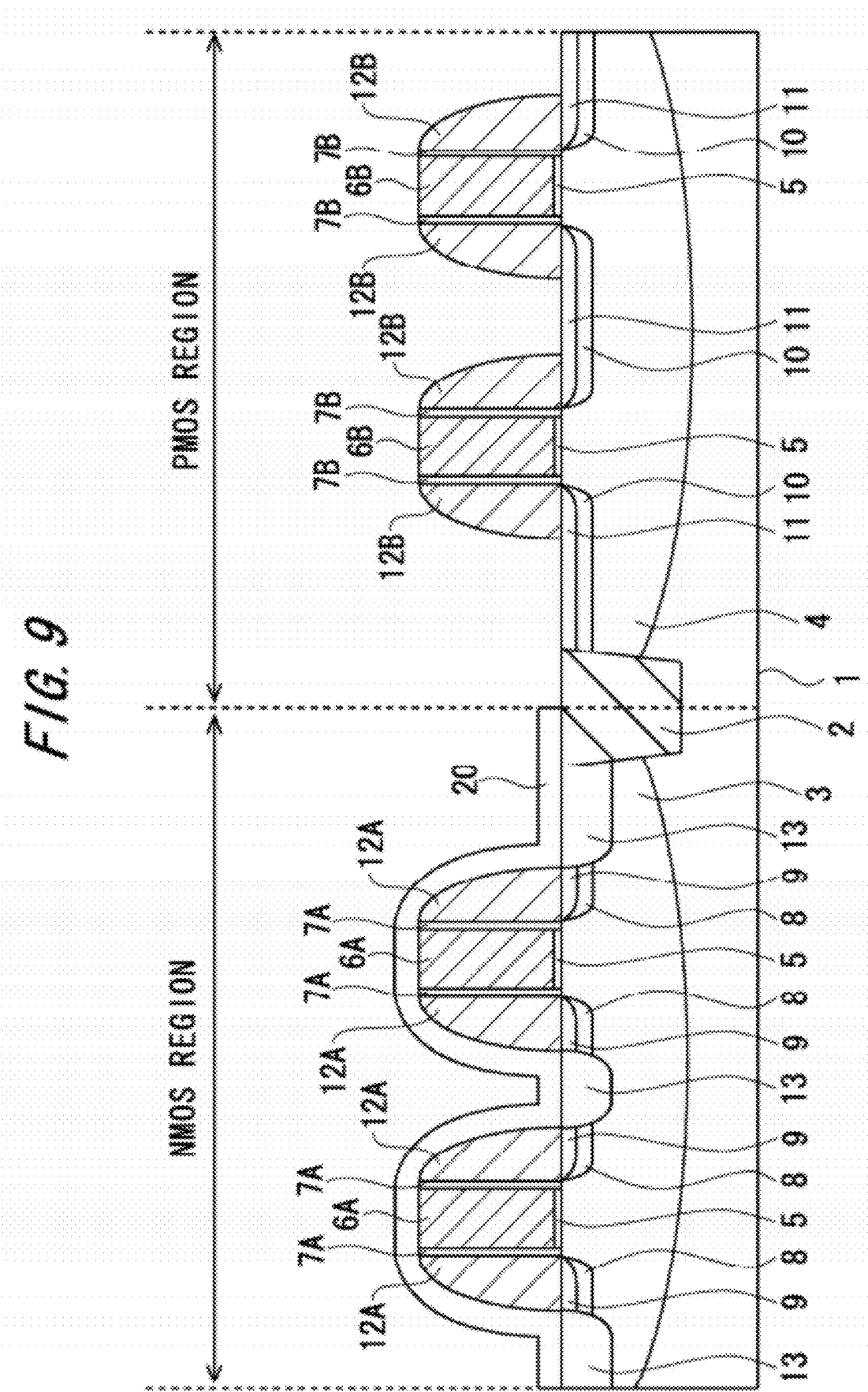
FIG. 9 is a sectional view (part 6) of the semiconductor device according to the embodiment.

The discussion gets back to the description of the step of manufacturing the semiconductor device. The surface of the silicon substrate 1 is rinsed by using an SPM (sulfuric acid hydrogen peroxide mixture) solution to which the hydrofluoric acid is added or an APM (ammonia hydrogen peroxide mixture) solution to which the hydrofluoric acid is added. The lifted-off residue of the oxide film 20 is removed by the rinsing process for the silicon substrate 1. FIG. 9 is a sectional view of the semiconductor device in the case of removing the residue of the oxide film 20 in the PMOS region.

Figure 10:
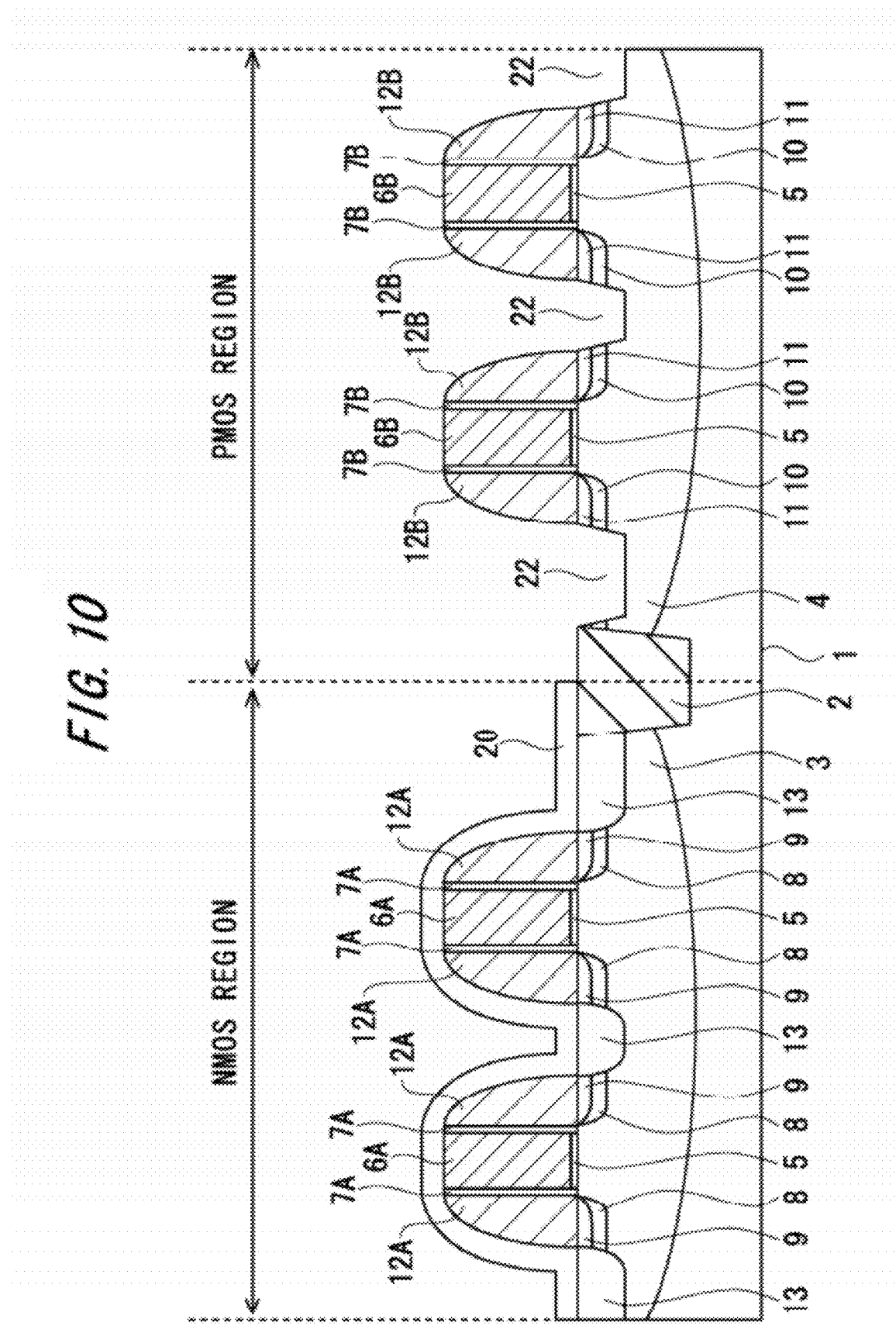
FIG. 10 is a sectional view (part 7) of the semiconductor device according to the embodiment.

Next, a recess 22 is formed in the surface of a portion, exposed from the oxide film 20, of the silicon substrate 1 by conducting the etching, in which the oxide film 20 in the NMOS region is used as the mask. Namely, the recess 22 is formed in the surface of the silicon substrate 1 in the NMOS region. The executable etching may be attained by any one of isotropic dry etching, isotropic wet etching and anisotropic dry etching or by a combination thereof. A depth of the recess 22 is equal to or larger than, e.g., 20 nm but equal to or smaller than 100 nm. FIG. 10 is a sectional view of the semiconductor device in the case of forming the recess 22 in the surface of the silicon substrate 1.

Figure 11:
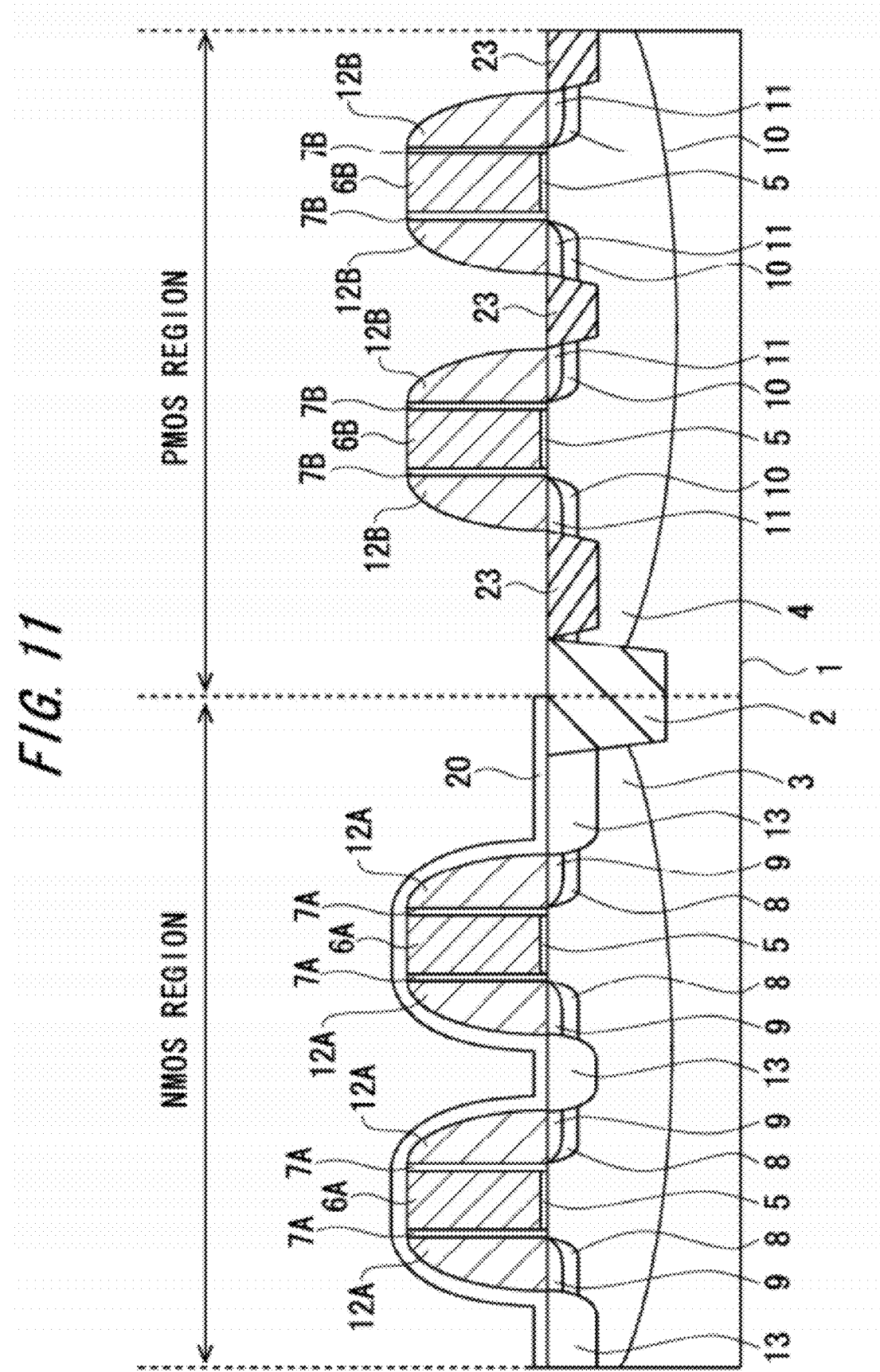
FIG. 11 is a sectional view (part 8) of the semiconductor device according to the embodiment.

Subsequently, a natural oxide film on the surface of the recess 22 is removed by the wet process using the hydrofluoric acid. Then, SiGe (silicon germanium) is selectively grown within the recess 22 by the CVD method, thereby forming a SiGe layer 23 within the recess 22. FIG. 11 is a sectional view of the semiconductor device in the case of forming the SiGe layer 23 within the recess 22 of the silicon substrate 1.

In the case of employing a mixed gas of $H_2$ (hydrogen), $SiH_4$ (silane), $B_2H_6$ (diborane), HCl (hydrochloric acid) and $GeH_4$ (germane), the SiGe layer 23 is formed within the recess 22 under the following conditions by way of one example.

Substrate temperature: 500° C. or above but 750° C. or under (e.g., 550° C.),
Total pressure of the mixed gas: 1333.22 Pa,
Partial pressures of respective gases, $H_2$ (hydrogen): 1000 Pa or above but 1500 Pa or under (e.g., 1300 Pa), $SiH_4$ (silane): 4 Pa or above but 10 Pa or under (e.g., 6 Pa), $B_2H_6$ (diborane): 1E-3 Pa or above but 2E-3 Pa or under (e.g., 1.3E-3 Pa), HCl (hydrochloric acid): 1.8 Pa or above but 2.2 Pa (e.g., 2 Pa), $GeH_4$ (germane): 4 Pa or above but 10 Pa or under (e.g., 2 Pa),
Si (silicon) growth speed: 1 nm/min, and
B (boron) concentration: $1E19/cm^3$ or above but $1E21/cm^3$.

The oxide film 20 is formed in a way that covers the silicon substrate 1 in the NMOS region, and hence the SiGe layer 23 is formed neither on the surface of the silicon substrate 1 in the NMOS region, nor on the first gate electrode 6A nor on the first sidewall 12A. Thus, the oxide film in the NMOS region functions as a SiGe growth preventive mask.

Figure 12:
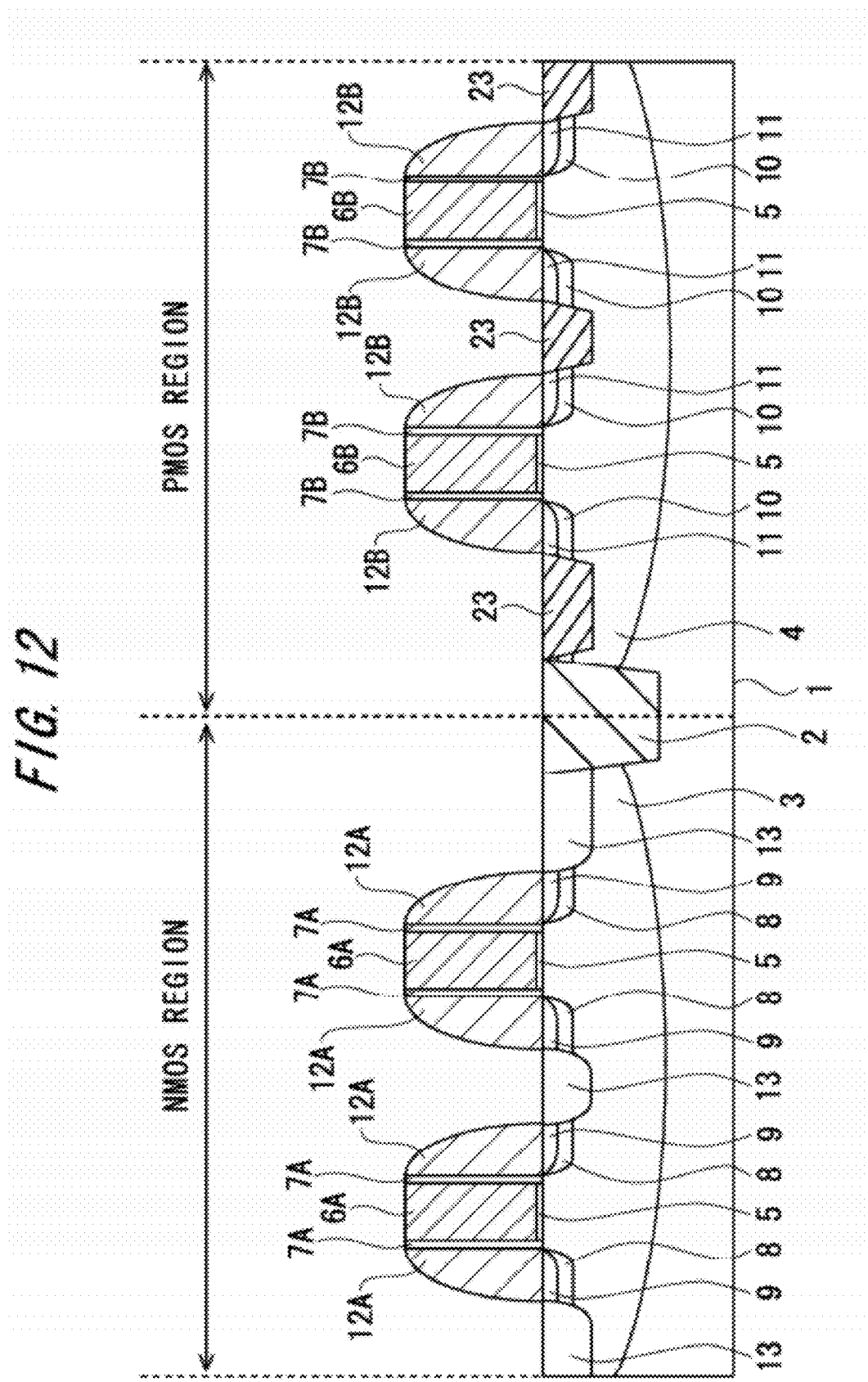
FIG. 12 is a sectional view (part 9) of the semiconductor device according to the embodiment.

Then, the oxide film 20 in the NMOS region is removed by the wet process which employs the hydrofluoric acid. In this case, the oxide film 20 in the NMOS region may be removed by further performing the dry etching. FIG. 12 is a sectional view of the semiconductor device in the case of removing the oxide film 20 in the NMOS region. Note that if the source/drain region 13 is not formed, the source/drain region 13 may be formed after removing the oxide film 20 in the NMOS region.

Figure 13:
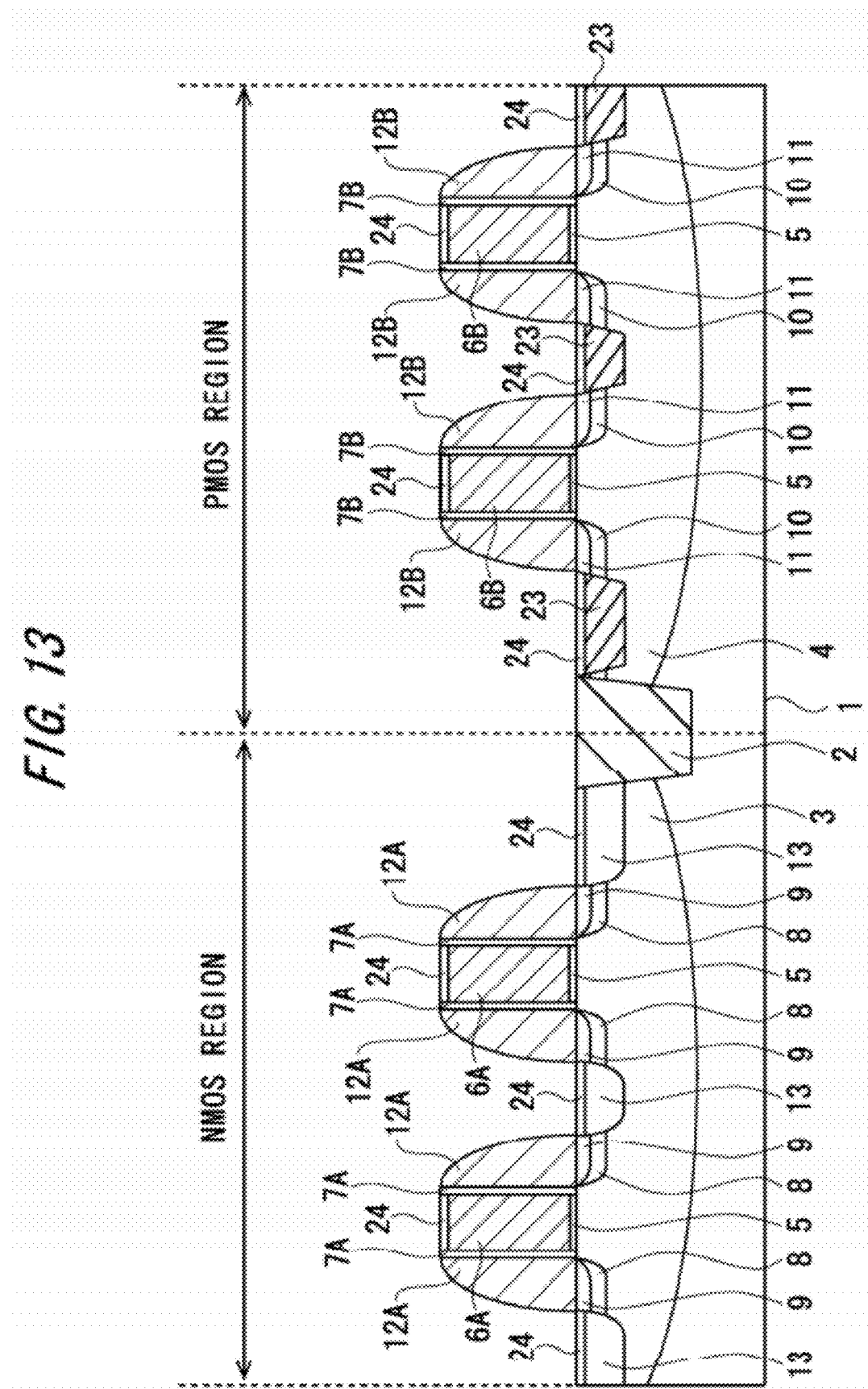
FIG. 13 is a sectional view (part 10) of the semiconductor device according to the embodiment.

Next, a refractory metal film of Ni (nickel), Co (cobalt), etc is formed by a sputtering method over the entire surface of the silicon substrate 1. Subsequently, silicide layers 24 are formed on the upper surface of the first gate electrode 6A, the upper surface of the second gate electrode 6B, the upper surface of the silicon substrate 1 in the source/drain region 13 and the upper surface of the SiGe layer 23 by annealing the refractory metal films, respectively. FIG. 13 is a sectional view of the semiconductor device in the case of forming the silicide layer 24.

Then, a silicon oxide ($SiO_2$) film is formed as an interlayer insulating film 30 on and above the silicon substrate 1 by the plasma CVD method that uses the TEOS (tetra ethoxy silane) gas as the raw material. Next, the interlayer insulating film 30 is polished by the CMP method, thus flattening the upper surface of the interlayer insulating film 30.

Subsequently, the photo resist film is formed on the interlayer insulating film 30 by the spin coating method and undergoes the patterning by the photolithography, thereby forming a resist for a contact on the inter-layer insulating film 30. Then, the anisotropic dry etching is conducted by using the resist for the contact as the mask, thereby forming a contact hole in the interlayer insulating film 30.

Next, a barrier metal film is formed within the contact hole by the sputtering method. The barrier metal film is composed of, e.g., TaN (tantalum nitride), TiN (titanium nitride), etc. An example of forming the barrier metal film within the contact hole is herein exemplified, however, the step of forming the barrier metal film may be omitted.

Figure 14:
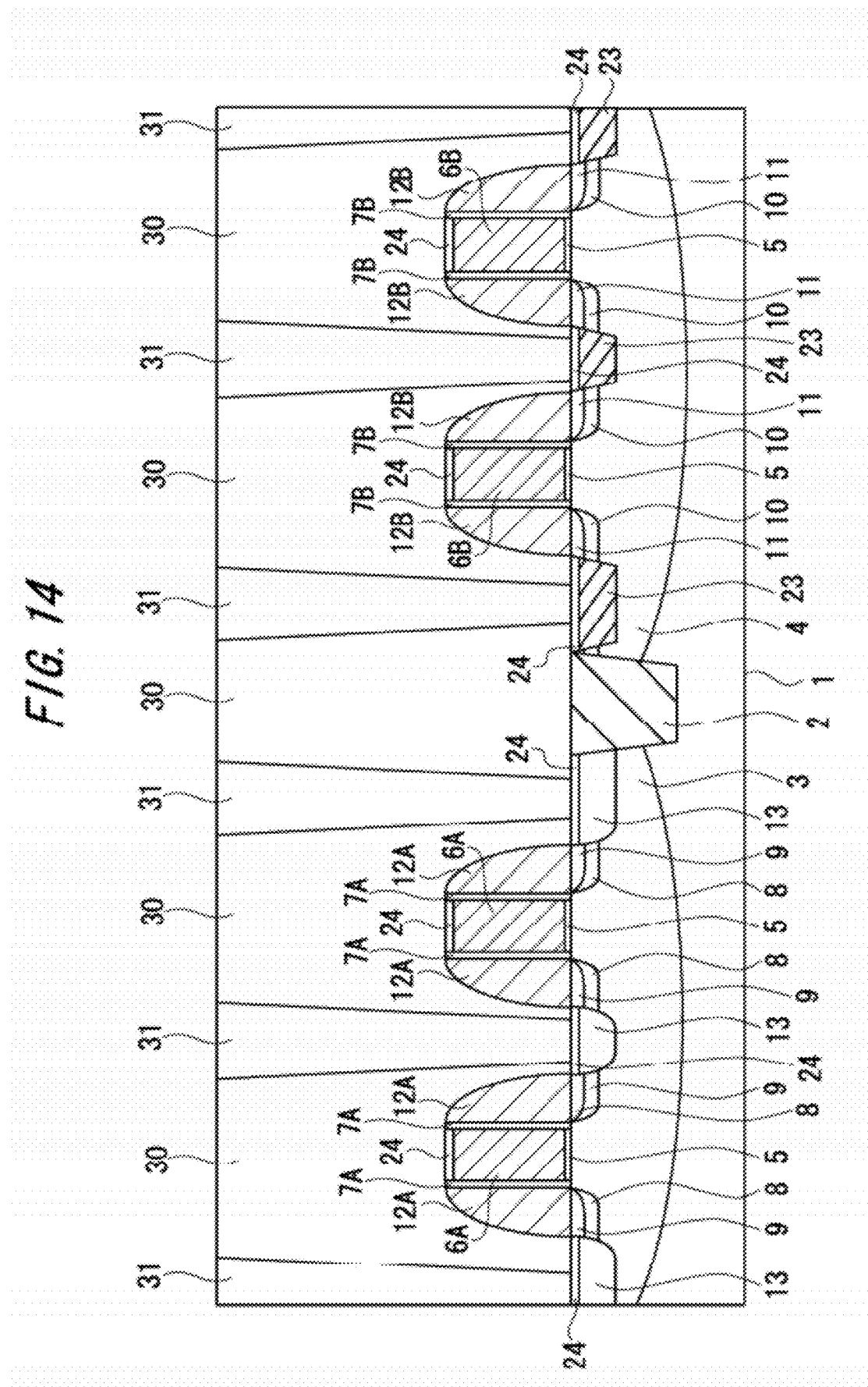
FIG. 14 is a sectional view (part 11) of the semiconductor device according to the embodiment.

Subsequently, a tungsten film is formed in the contact hole by the CVD method. In place of the tungsten film, a copper film may be formed in the contact hole. Then, the tungsten film and the barrier metal film are polished till the surface of the interlayer insulating film 30 gets exposed by the CMP method. As a result, a contact plug 31 is formed within the contact hole. FIG. 14 is a sectional view of the semiconductor device in the case of forming the interlayer insulating film 30 and the contact plug 31.

Figure 15:
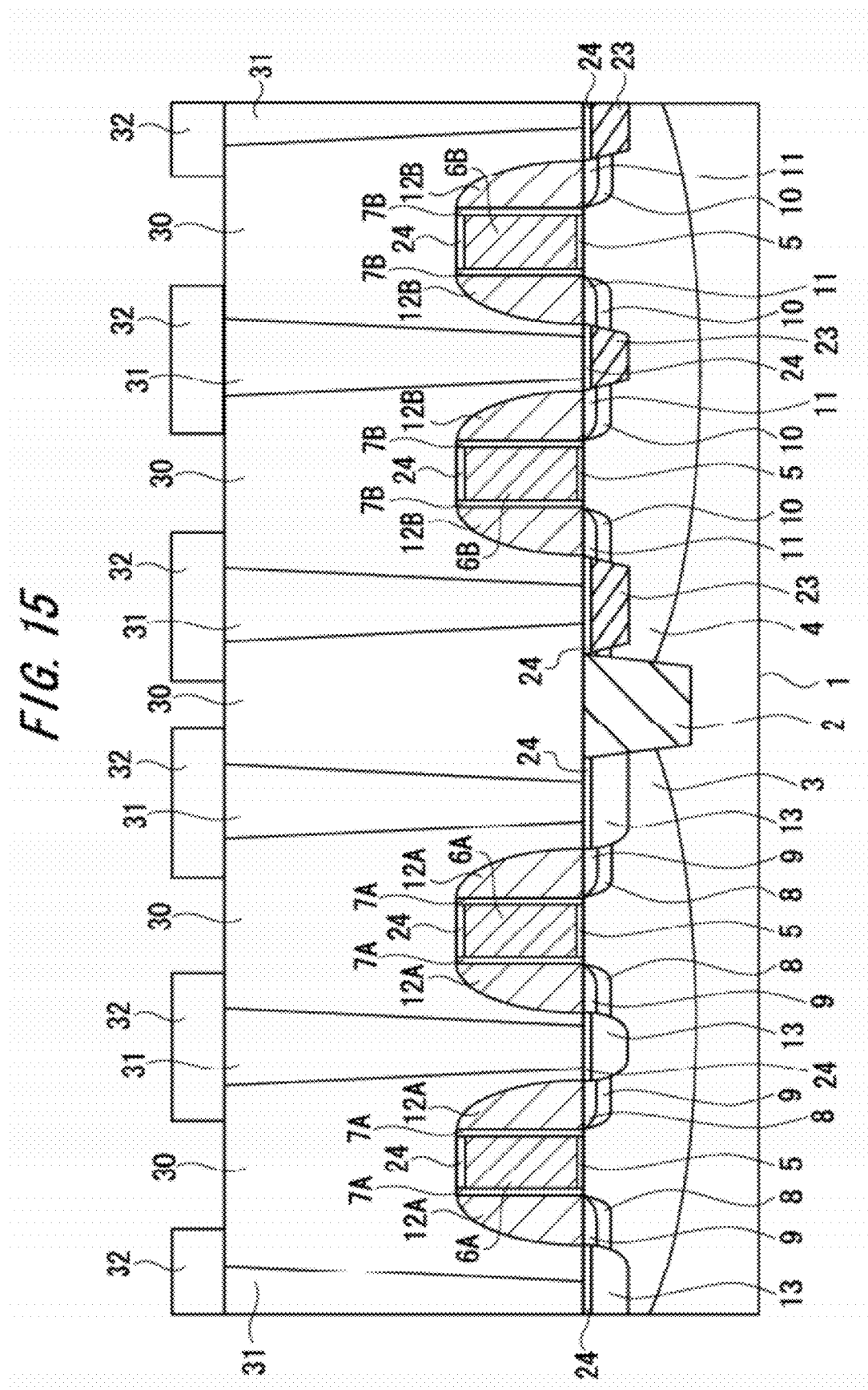
FIG. 15 is a sectional view (part 12) of the semiconductor device according to the embodiment.

Next, a metal film of Al (aluminum) etc is formed on the interlayer insulating film 30 by the sputtering method. Subsequently, the photo resist film is formed on the metal film by the spin coating method and undergoes the patterning by the photolithography, thereby forming a resist for wiring on the metal film. Then, a wiring layer 32 is formed on the interlayer insulating film 30 by performing the anisotropic dry etching, in which the resist for wiring serves as the mask. FIG. 15 is a sectional view of the semiconductor device in the case of forming the wiring layer 32. Corresponding to the necessity, a multilayered wiring structure may be configured by forming an interlayer insulating film, a via-plug and a wiring layer in the same steps as forming the interlayer insulating film 30, the contact plug 31 and the wiring layer 32.

Figure 16:
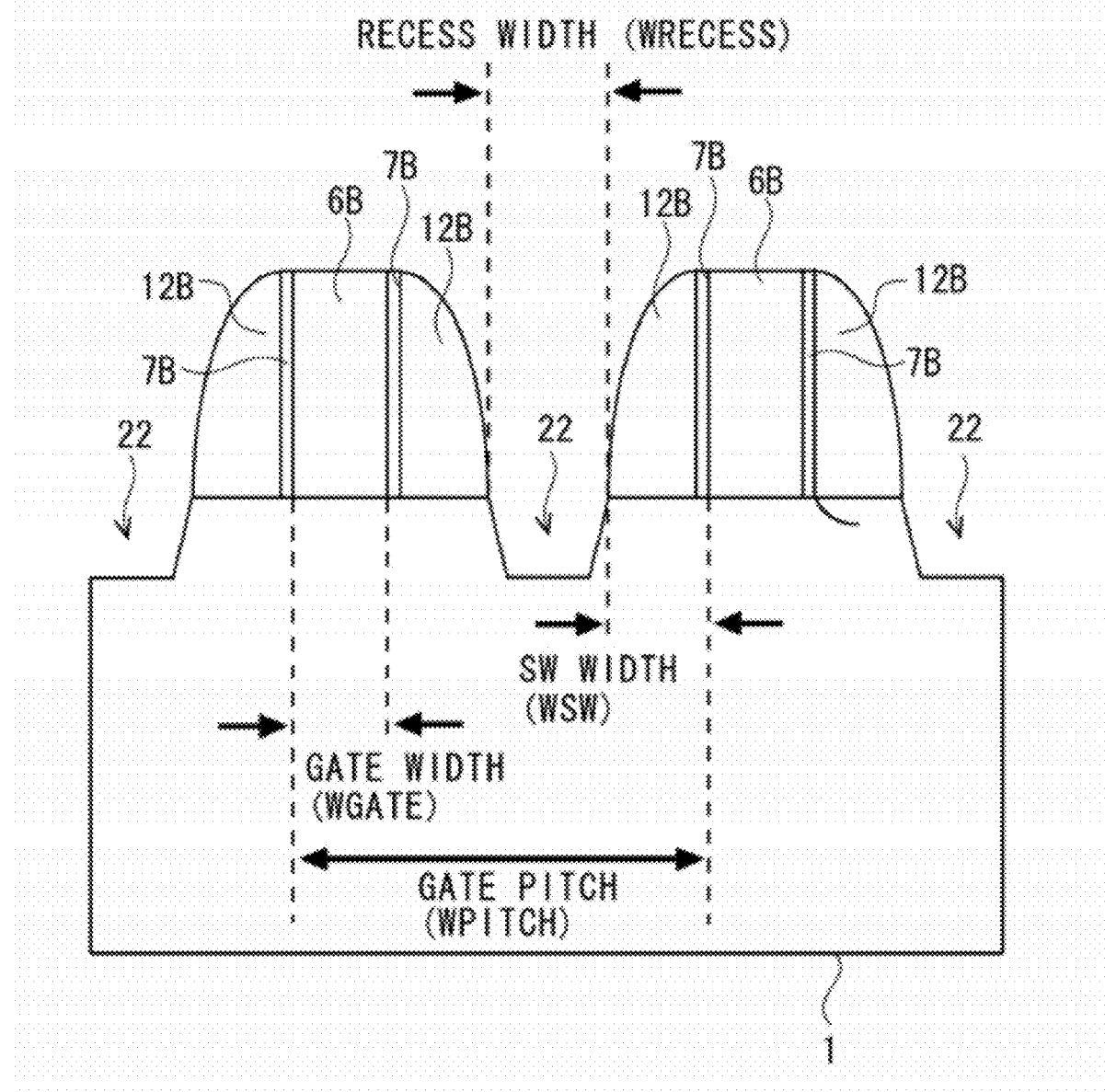
FIG. 16 is a diagram illustrating dimensions such as agate pitch (WPITCH), a gate width (WGATE), a SW width (WSW) and a recess width (WRECESS).

FIG. 16 depicts dimensions such as a gate pitch (Wpitch), a gate width (Wgate), a SW width (Wsw) and a recess width (Wrecess). The gate pitch (Wpitch) is defined as a pitch between the second gate electrodes 6B adjacent to each other. The gate width (Wgate) is a defined as a width of the second gate electrode 6B. The SW width (Wsw) is defined as a width including a width of the second thin sidewall 7B and a width of the second sidewall 12B. The recess width (Wrecess) is a width of the recess 22.

If the oxide film 20 has a large film thickness, it follows that the oxide film 20 with the uniform film thickness is not formed on the silicon substrate 1, while the recess width (Wrecess) of the narrow pitch portion is completely embedded by the oxide film 20. The film thickness of the oxide film 20 in order for the recess width (Wrecess) of the narrow pitch portion not to be completely embedded by the oxide film 20, depends on the gate pitch (Wpitch), the gate width (Wgate) and the SW width (Wsw) and may be calculated by the following formula.

$$Wrecess = Wpicth - Wgate - 2Wsw$$

If a film having high coverage is used as the oxide film 20, the film thickness of the oxide film 20 in order for the recess width (Wrecess) of the narrow pitch portion not to be completely embedded becomes a half of Wrecess (Wrecess/2). The film having the high coverage is a film exhibiting a small difference between the film thickness of the film grown on the flat portion and the film thickness of the film grown sideways of the sidewall. For example, when the gate pitch (Wpitch) is 140 nm, the gate width (Wgate) is 40 nm and the SW width (Wsw) is 30 nm, the recess width is given such as Wrecess=140 nm−40 nm−30 nm×2=40 nm. Accordingly, the film thickness of the oxide film 20 in order for the recess width (Wrecess) of the narrow pitch portion not to be completely embedded is given by 40 nm/2=20 nm.

According to the embodiment, the oxide film 20 is densified by executing the plasma process with the gas containing Cl with respect to the silicon substrate 1 and the oxide film 20 in the NMOS region, thereby the resistance against hydrofluoric acid of the oxide film 20 in the NMOS region to be improved. The resistance against hydrofluoric acid of the oxide film 20 in the NMOS region is improved, and hence the oxide film 20 in the NMOS region is not removed in the step of removing the natural oxide film on the surface of the recess 22 by the wet process which uses the hydrofluoric acid. It is therefore feasible to avoid forming the SiGe layer 23 in the NMOS region in the step of forming the SiGe layer 23 within the recess 22 of the semiconductor substrate 1 in the PMOS region.

Further, according to the embodiment, the residue of the oxide film 20, which remains on the silicon substrate 1, is lifted off by executing the plasma process with the gas containing Cl with respect to the silicon substrate 1 and the oxide film 20 in the NMOS region. The lifted-off residue of the oxide film 20 is removed by the rinsing process for the silicon substrate 1. The oxide film 20 in the PMOS region is completely removed, and it is therefore possible to obviate the problem that a part of the oxide film 20 remains in the PMOS region. As a result, the recess 22 taking a desired shape is formed on the surface of the silicon substrate 1 in the PMOS region, and it is feasible to restrain occurrence of a failure in shape of the recess 22 formed on the surface of the silicon substrate 1 in the PMOS region. The recess 22 taking the desired shape is formed on the surface of the silicon substrate 1 in the PMOS region, and hence the dispersion in width of the SiGe layer 23 formed within the recess 22 is restrained. With this scheme, a magnitude of the compressive strain applied to the channel region is stabilized, thereby enabling the characteristics of the PMOSFET to be stabilized.

The embodiment has exemplified the example in which the oxide film 20 is densified by executing the plasma process with the gas containing Cl with respect to the silicon substrate 1 and the oxide film 20 in the NMOS region, and the residue of the oxide film 20 which remains on the silicon substrate 1 is lifted off. Namely, the embodiment has exemplified the example of densifying the oxide film 20 and lifting off the residue of the oxide film 20 which remains on the silicon substrate 1 through one step. The operation is not limited to this step mode, the step of densifying the oxide film 20 and the step of lifting off the residue of the oxide film 20 which remains on the silicon substrate 1, may be set as separate steps. In the case of setting the separate steps, the oxide film 20 may be densified by executing the plasma process with the gas containing He with respect to the silicon substrate 1 and the oxide film 20 in the NMOS region. Further, in the case of setting the separate steps, the residue of the oxide film 20 which remains on the silicon substrate 1 may be lifted off by use of the Cl gas that is not set in the plasma state.

According to the embodiment, it is feasible to restrain the SiGe layer from being grown in the NMOS region and to inhibit occurrence of failure in shape of the SiGe layer of the PMOS region.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. A method of manufacturing a semiconductor device, comprising:
   forming a first gate electrode in a first region of a semiconductor substrate and forming a second gate electrode in a second region of the semiconductor substrate;
   forming a first sidewall spacer along a lateral wall of the first gate electrode and forming a second sidewall spacer along a lateral wall of the second gate electrode;

forming an oxide film so as to cover the semiconductor substrate, the first gate electrode, the second gate electrode, the first sidewall spacer and the second sidewall spacer;

forming a resist above the oxide film so as to cover the first region of the semiconductor substrate;

removing the oxide film in the second region of the semiconductor substrate by etching the oxide film with the resist serving as a mask;

removing the resist; and executing a plasma process by using a gas containing chlorine with respect to the semiconductor substrate and the oxide film in the first region of the semiconductor substrate to increase etch resistance of the oxide film against hydrofluoric acid.

2. The method of manufacturing the semiconductor device according to claim 1, further comprising removing the oxide film remaining in the second region of the semiconductor substrate by rinsing the semiconductor substrate.

3. The method of manufacturing the semiconductor device according to claim 2, further comprising:

forming a recess in a surface of the semiconductor substrate in the second region of the semiconductor substrate; and forming a silicon germanium within the recess.

4. The method of manufacturing the semiconductor device according to claim 1, wherein the oxide film is formed by using a raw gas containing TEOS, BTBAS or TDMA.

5. A method of manufacturing a semiconductor device, comprising:

forming a first gate electrode in a first region of a semiconductor substrate and a second gate electrode in a second region of the semiconductor substrate;

forming a first sidewall spacer on a sidewall of the first gate electrode and a second sidewall spacer on a sidewall of the second gate electrode;

forming a source region and a drain region in the first region of the semiconductor substrate;

forming a silicon oxide film above the semiconductor substrate, the first gate electrode, the second gate electrode, the first sidewall spacer and the second sidewall spacer;

removing the silicon oxide film in the second region; and executing a plasma process using a gas containing chlorine to the semiconductor substrate and the silicon oxide film in the first region to increase etch resistance of the silicon oxide film against hydrofluoric acid.

6. The method of manufacturing the semiconductor device according to claim 5, further comprising:

rinsing the semiconductor substrate after the plasma process.

7. The method of manufacturing the semiconductor device according to claim 6, wherein the rinsing uses a fluid containing a hydrofluoric acid.

8. The method of manufacturing the semiconductor device according to claim 5, further comprising:

forming a recess in the second region of the semiconductor substrate after the plasma process; and forming a silicon germanium in the recess.

9. The method of manufacturing the semiconductor device according to claim 5, wherein the oxide film is formed by using a raw gas containing TEOS, BTBAS or TDMA.

10. The method of manufacturing the semiconductor device according to claim 8, further comprising:

removing the oxide film in the first region after forming the silicon germanium;

forming a silicide layer on the first gate electrode, the second gate electrode, the silicon germanium, the source region and the drain region;

forming an insulating film above the silicide layer;

forming a hole in the insulating film;

forming a conductive layer in the hole.

* * * * *